(12) United States Patent
Perreault et al.

(10) Patent No.: US 12,126,324 B2
(45) Date of Patent: Oct. 22, 2024

(54) PIEZOELECTRIC RESONATORS FOR POWER CONVERSION

(71) Applicant: Massachusetts Institute of Technology, Cambridge, MA (US)

(72) Inventors: David J. Perreault, Cambridge, MA (US); Jessica Boles, Murfreesboro, TN (US); Jeffrey H. Lang, Sudbury, MA (US); Joseph Bonavia, Millbrae, CA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 18/558,207

(22) PCT Filed: May 6, 2022

(86) PCT No.: PCT/US2022/028043
§ 371 (c)(1),
(2) Date: Oct. 31, 2023

(87) PCT Pub. No.: WO2022/236034
PCT Pub. Date: Nov. 10, 2022

(65) Prior Publication Data
US 2024/0322789 A1    Sep. 26, 2024

Related U.S. Application Data

(60) Provisional application No. 63/185,663, filed on May 7, 2021.

(51) Int. Cl.
*H03H 9/17*    (2006.01)

(52) U.S. Cl.
CPC .................................. *H03H 9/17* (2013.01)

(58) Field of Classification Search
CPC ..... H10N 30/40; H10N 30/802; H10N 30/804
USPC .................................................. 310/314, 318
See application file for complete search history.

(56) References Cited

U.S. PATENT DOCUMENTS

| | | |
|---|---|---|
| 5,329,439 A | 7/1994 | Borojevic et al. |
| 6,081,438 A | 6/2000 | Saint-Pierre et al. |
| 9,438,233 B1 | 9/2016 | Marr et al. |
| 10,396,673 B1 | 8/2019 | Presti et al. |

(Continued)

FOREIGN PATENT DOCUMENTS

| | | |
|---|---|---|
| CN | 103023454 A | 4/2013 |
| WO | WO 2020/252250 | 12/2020 |

OTHER PUBLICATIONS

Non-Final Office Action dated Oct. 26, 2023, for U.S. Appl. No. 17/605,255; 16 pages.

(Continued)

*Primary Examiner* — Derek J Rosenau
(74) *Attorney, Agent, or Firm* — Daly, Crowley, Mofford & Durkee, LLP

(57) ABSTRACT

Described are structures and techniques for providing high-efficiency, high-power-density piezoelectric resonators (PRs) for use in power converters. In some embodiments, a power converter can include a PR for energy transfer, where the PR substantially satisfies geometry conditions disclosed herein for achieving high-efficiency and high-power-density. The geometry conditions can be defined in terms of the converter's specified (e.g., rated) voltage and power level.

16 Claims, 13 Drawing Sheets

(56) References Cited

U.S. PATENT DOCUMENTS

| | | |
|---|---|---|
| 2004/0145920 A1 | 7/2004 | Xu et al. |
| 2006/0238070 A1* | 10/2006 | Costa ............... H10N 30/40 |
| | | 310/318 |
| 2006/0262576 A1 | 11/2006 | Przybyla et al. |
| 2006/0290449 A1 | 12/2006 | Piazza et al. |
| 2007/0120441 A1* | 5/2007 | Matsuo ............. H05B 41/2822 |
| | | 310/318 |
| 2009/0200896 A1 | 8/2009 | Morris et al. |
| 2010/0104313 A1 | 4/2010 | Kosaka et al. |
| 2010/0277262 A1 | 11/2010 | Phan Le et al. |
| 2010/0328969 A1 | 12/2010 | Meyer |
| 2014/0184024 A1 | 7/2014 | Loverich et al. |
| 2015/0145986 A1 | 5/2015 | Symko et al. |
| 2018/0173256 A1 | 6/2018 | Dauzat |
| 2018/0287503 A1 | 10/2018 | Despesse et al. |
| 2019/0356222 A1 | 11/2019 | Lesso et al. |
| 2020/0098968 A1 | 3/2020 | Despesse et al. |
| 2022/0200449 A1 | 6/2022 | Perreault et al. |

OTHER PUBLICATIONS

Response to Non-Final Office Action dated Oct. 26, 2023, for U.S. Appl. No. 17/605,255; Response filed Jan. 15, 2024; 9 pages.

Vazquez Carazo, "Piezoelectric Transformers: An Historical Review"; Actuators, vol. 5, No. 2, MDPI; Apr. 2016; 22 pages.

Bronstein et al., "Design Considerations for Achieving ZVS in a Half Bridge Inverter That Drives a Piezoelectric Transformer with no Series Inductor"; Proceedings of the IEEE Power Electronics Specialists Conference, vol. 2, Australia; Jun. 2002; pp. 585-590 (6 pages).

Chen et al., "ZVS Considerations for a Phase-Lock Control DC-DC Converter With Piezoelectric-Transformer"; Proc. Annual Conference of the IEEE Industrial Electronics Society; Nov. 2006 in Paris, France; pp. 2244-2248 (5 pages).

Rodgaard et al., "Empiric Analysis of Zero Voltage Switching in Piezoelectric Transformer Based Resonant Converters"; Proc. IET International Conference on Power Electronics, Machines, and Drives; Mar. 2012 in Bristol, United Kingdom; 6 pages.

Rodgaard et al., "Bi-Directional Piezoelectric Transformer Based Converter for High-Voltage Capacitive Applications"; Proc. IEEE Applied Power Electronics Conference and Exposition; Mar. 2015 in Charlotte, North Carolina; pp. 1993-1998 (6 pages).

Rodgaard et al., "Forward Conduction Mode Controlled Piezoelectric Transformer-Based PFC LED Drive"; IEEE Transactions on Power Electronics, vol. 28, No. 10; 2012; pp. 4841-4849 (9 pages).

Ekhtiari et al., "Analysis of Bi-Directional Piezoelectric-Based Converters for Zero-Voltage Switching Operation"; IEEE Transactions on Power Electronics, vol. 32, No. 1; 2017; pp. 866-877 (12 pages).

Sanz et al., "Magnetic-less Converter Based on Piezoelectric Transformers for Step-Down DC/DC and Low Power Application"; Proc. IEEE Applied Power Electronics Conference and Exposition; Feb. 2003 in Miami Beach, Florida; pp. 615-621 (7 pages).

Vasic et al., "Piezoelectric Transformer-Based DC/DC Converter with Improved Burst-Mode Control"; 2013 IEEE Energy Conversion Congress and Exposition; 2013; pp. 140-146 (7 pages).

Ju et al., "Piezoelectric Ceramic Acting as Inductor for Capacitive Compensation in Piezoelectric Transformer"; IET Power Electronics, vol. 8, No. 10; 2015; pp. 2009-2015 (7 pages).

Ekhtiari et al., "State-of-the-Art Piezoelectric Transformer-Based Switch Mode Power Supplies"; IECON 40$^{th}$ Annual Conference of the IEEE Industrial Electronics Society; 2014; pp. 5072-5078 (7 pages).

Foster et al., "Critical Design Criterion for Achieving Zero Voltage Switching in Inductorless Half-Bridge-Driven Piezoelectric-Transformer-Based Power Supplies"; IEEE Transactions on Power Electronics, vol. 31, No. 7; 2015; pp. 5057-5066 (10 pages).

Lin et al., "Inductor-less Piezoelectric Transformer Electronic Ballast for Linear Fluorescent Lamp"; Proc. IEEE Applied Power Electronics Conference and Exposition; Mar. 2001 in Anaheim, California; pp. 664-669 (6 pages).

Equivalent Circuit Parameters for Piezo Transformers; Steiner & Martins, Inc.; online: https://steminc.com/piezo/EquivCircuitPT.asp; 1 page.

Pollet et al., "Inductor-less DC-DC converter using a piezoelectric transducer"; HAL archives0ouvertes. Fr., Journeés Nationales sur la Recuperation et le Stockage d'Energie (JNRSE) 2017, Lyon, May 9-10, 2017; 3 pages.

International Search Report and Written Opinion dated Sep. 13, 2022, for International Application No. PCT/US2022/028043; 7 pages.

Boles et al, "Enumeration and Analysis of DC-DC Converter Implementations Based on Piezoelectric Resonators"; IEEE Transactions on Power Electronics, vol. 36, No. 1; Jun. 2020; 17 pages.

International Search Report and Written Opinion dated Dec. 4, 2020, for Application No. PCT/US20/37418; 13 Pages.

International Preliminary Report on Patentability dated Dec. 23, 2021, for Application No. PCT/US20/37418; 8 Pages.

International Search Report and Written Opinion dated Feb. 3, 2023, for Application No. PCT/US2022/045750; 11 pages.

PCT International Search Report and Written Opinion dated Oct. 13, 2022, for International Application No. PCT/US2022/036325; 8 pages.

Touhami et al., "Implementation of Control Strategy for Step-Down DC-DC Converter Based on Piezoelectric Resonator"; 22$^{nd}$ European Conference on Power Electrics and Applications; IEEE 2020; 9 pages.

Sullivan et al., "On Size and Magnetics: Why Small Efficient Power Inductors Are Rare"; Proceedings of the IEEE Intl. Symposium on 3D Power Electronic Integration and Manufacturing; Jun. 2016. pp. 1-23 (23 pages).

Perreault et al., "Opportunities and Challenges in Very High Frequency Power Conversion"; Proceedings of the IEEE Applied Power Electronics Conference and Exposition; Feb. 2009. pp. 1-14 (14 pages).

Kyaw et al., "Fundamental Examination of Multiple Potential Passive Component Technologies for Future Power Electronics"; IEEE Transactions on Power Electronics, vol. 33, No. 12; 2018; 9 pages.

Braun et al., "Inductorless Soft Switching DC-DC Converter with an Optimized Piezoelectric Resonator"; Proceedings of the IEEE Applied Power Electronics Conference and Exposition; Mar. 2020 in New Orleans, Louisiana; pp. 2272-2278 (7 pages).

Moon et al., "High Power DC-DC Conversion Applications of Disk-Type Radial Mode Pb (Zr, Ti) O3 Ceramic Transducer"; Japanese Journal of Applied Physics, vol. 50, No. 9S2; 2011; p. 09ND20 (7 pages).

Pollet et al., "A New Non-Isolated Low Power Inductorless Piezoelectric DC-DC Converter"; IEEE Transactions on Power Electronics, vol. 34, No. 11; 2019; pp. 11002-11013 (12 pages).

Flynn et al., "Fundamental Limits on Energy Transfer and Circuit Considerations for Piezoelectric Transformers"; IEEE Transactions on Power Electronics, vol. 17, No. 1; 2002. pp. 8-14 (7 pages).

Alonso et al., "A Novel Control Method for Piezoelectric-Transformer Based Power Supplies Assuring Zero-Voltage-Switching Operation"; IEEE Transactions on Industrial Electronics, vol. 55, No. 3; 2008; pp. 1085-1089 (5 pages).

Ekhtiari et al., "Dynamic Optimum Dead Time in Piezoelectric Transformer-Based Switch-Mode Power Supplies"; IEEE Transactions on Power Electronics, vol. 32, No. 1; 2017; pp. 783-793 (11 pages).

Horsley et al., "Analysis of Inductorless Zero-Voltage-Switching Piezoelectric Transformer-Based Converters"; IEEE Transactions on Power Electronics, vol. 27, No. 5; 2012; pp. 2471-2483 (13 pages).

Boles et al., "High-Efficiency Operating Modes for Isolated Piezoelectric-Transformer-Based DC-DC Converters"; Proceedings of the IEEE Workshop on Control and Modeling for Power Electronics; Nov. 30, 2020; pp. 1-8 (8 pages).

Van Dyke et al., "The Piezo-Electric Resonator and Its Equivalent Network"; Proceedings of the Institute of Radio Engineers, vol. 16, No. 6; May 1928; pp. 742-764 (23 pages).

(56) References Cited

OTHER PUBLICATIONS

Ballato et al., "Modeling Piezoelectric and Piezomagnetic Devices and Structures via Equivalent Networks"; IEEE Transactions on Ultrasonics, Ferroelectrics, and Frequency Control, vol. 48, No. 5; 2001; pp. 1189-1240 (52 pages).
Wang et al., "Comprehensive Analysis of Models and Operational Characteristics of Piezoelectric Transformers"; Proc. IEEE Applied Power Electronics Conference and Exposition; Mar. 2020 in New Orleans, Louisiana; pp. 1422-1429 (8 pages).
Sherrit et al., "Comparison of the Mason and KLM Equivalent Circuits for Piezoelectric Resonators in the Thickness Mode"; Proc. IEEE Ultrasonics International Symposium, vol. 2; Oct. 1999 in Tahoe, Nevada; pp. 921-926 (6 pages).
Boles et al., "Analysis of High-Efficiency Operating Modes for Piezoelectric Resonator-Based DC-DC Converters"; Proc. IEEE Applied Power Electronics Conference and Exposition; Mar. 2020 in New Orleans, Louisiana; pp. 1-8 (8 pages).
"Ready to Deliver Piezoelectric Ceramics"; APC International, Ltd. [Online] at: https://www.americanpiezo.com/ready-to-deliver-piezoelectric-cermaics.html; accessed: Oct. 30, 2023; 16 pages.
"Physical and Piezoelectric Properties of APC Materials"; APC International, Ltd. [Online] at: https://www.americanpiezo.com/apc-materials/physical-piezoelectric-properties.html; accessed: Oct. 30, 2023; 3 pages.
"Ceramic Materials"; Boston Piezo Optics Inc. [Online] at: https://www.bostonpiezooptics.com/ceramic-materials-pzt; accessed: Oct. 30, 2023; 3 pages.
"Ceramic Components"; Omega Piezo Technologies. [Online] at: https://www.omegapiezo.com/ceramic-components/; accessed: Oct. 30, 2023; 3 pages.
"Electro-Ceramic Products and Material Specifications"; Harris Corporation; 2017; 46 pages.
"PZT Materials Complete Properties"; CTS Corporation; Jul. 2021; 5 pages.
"Piezoceramic Hard Materials Material Data"; CeramTec.; Nov. 2019; 3 pages.
Berlincourt et al., "Properties of Morgan Electro Ceramic Ceramics"; Technical Publication TP-226; Morgan Electro Ceramics; 2000. (12 pages).
Boles et al., "Evaluating Piezoelectric Materials for Power Conversion"; Proceedings of the IEEE Workshop on Control and Modeling for Power Electronics; Nov. 2020; 8 pages.
Braun et al., "Optimized Resonators for Piezoelectric Power Conversion"; IEEE Open Journal of Power Electronics; Mar. 2021; 13 pages.
Touhami et al., "A New Topology of DC-DC Converter Based on Piezoelectric Resonator"; 2020 IEEE 21$^{st}$ Workshop on Control and Modeling for Power Electronics (COMPEL); 2020; pp. 1-7 (7 pages).
Yang et al., "Resonant Current Estimation and Phase-Locked Loop Feedback Design for Piezoelectric Transformer-Based Power Supplies"; IEEE Transactions on Power Electronics, vol. 35, No. 10; 2020; pp. 10466-10476 (11 pages).
Forrester et al., "Influence of Spurious Modes on the Efficiency of Piezoelectric Transformers: A Sensitivity Analysis"; IEEE Transactions on Power Electronics, vol. 36, No. 1; Jan. 2021; 13 pages.
Hubert et al., "Piezoelectric EMI Filter for Switched-Mode Power Supplies"; IEEE Transactions on Power Electronics, vol. 36, No. 6; Jun. 2021; 20 pages.
Wang et al., "Design and Analysis of Tunable Piezoelectric Transformer Based DC/DC Converter with AC Output Inductor"; 2020 IEEE Applied Power Electronics Conference and Exposition; Mar. 2020 in New Orleans, Louisiana; pp. 1398-1403 (6 pages).
Uchino et al., "Loss Mechanisms in Piezoelectrics: How to Measure Different Losses Separately"; IEEE Transactions on Ultrasonics, ferroelectrics, and frequency control, vol. 48, No. 1; 2001; pp. 307-321 (15 pages).
"Material Properties"; Piezo Technologies. [Online] at: https://www.piezotechnologies.com/materials-chart/; 1 page.
"Physical and Piezoelectric Properties of T&P Materials"; T & Partners Praha [Online] at: https://www.tpartnerspraha.com/maretials-type-1.html; accessed: Oct. 30, 2023; 2 pages.
"Lithium Niobate"; Boston Piezo Optics Inc. [Online] at: https://www.bostonpiezooptics.com/lithium-niobate; accessed: Oct. 30, 2023; 5 pages.
Costinett et al., "Circuit-Oriented Treatment of Nonlinear Capacitances in Switched-Mode Power Supplies"; IEEE Transactions on Power Electronics, vol. 30, No. 2; 2014; pp. 985-995 (11 pages).

* cited by examiner

PIEZOELECTRIC RESONATORS FOR POWER CONVERSION

CROSS REFERENCE TO RELATED APPLICATIONS

This application is a National Stage Entry of International Application No. PCT/US2022/028043, which was filed on May 6, 2022, which claims priority to and the benefit under 35 U.S.C. § 119 of U.S. Provisional Patent Application No. 63/185,663 filed on May 7, 2021. The entire contents of these applications are incorporated herein by reference.

FIELD

This disclosure relates generally to power electronics and, more particularly, to converters based upon piezoelectric resonators.

BACKGROUND

Magnetic energy storage elements such as inductors and transformers pose fundamental limits to miniaturization for power electronics; as magnetics scale to smaller sizes, their power density capabilities fundamentally decrease. This motivates exploration of power conversion based on other energy storage technologies. Piezoelectrics, which store energy in the mechanical compliance and inertia of a piezoelectric material, have very high power density and efficiency capabilities with improved scaling properties to small sizes compared to magnetics. Piezoelectrics also offer the advantages of planar form factors, ease of batch fabrication, and the potential to use the energy storage element itself for electrical isolation.

The promise of power conversion based on only piezoelectric energy storage is evident in magnetic-less converter designs having single-port piezoelectric resonators (PRs) as well as in designs having multi-port piezoelectric transformers (PTs). The use of a high-frequency lithium niobate PR to achieve high power density has been explored as have converter implementations catered to high step-down ratios.

SUMMARY

It is recognized herein that criteria for selecting piezoelectric materials and/or designing PRs and PTs themselves remain murky in the context of power conversion, and metrics developed for other applications serve different interests.

With proper selection of materials and PR operating modes, performance characteristics which are much improved relative to convention performance characteristics can be achieved. For example, a shape (e.g., dimensions) and mode may be selected to increase, and ideally maximize, both power density and efficiency.

Described herein are techniques for deriving figures of merit (FOMs) for piezoelectric materials and vibration modes specifically for use as energy storage components in power electronics. In particular, disclosed are achievable efficiency and power handling density FOMs for PRs, which can be derived to be functions of only material properties for each vibration mode in a converter control sequence. Also described is the use of these FOMs to compare commercially-available materials and vibration modes, which are validated both numerically and experimentally. In addition to material selection, these FOM derivations aid PR geometry design and elucidate the fundamental power handling scaling properties for a PR in a converter implementation. Also described herein are techniques and means for selecting piezoelectric materials and vibration mode for use in power conversion, as well as for techniques and means to design/size PRs and PTs using these selected materials and modes to achieve both high power density and efficiency. Also described herein are power conversion systems, circuits, devices, and other structures using piezoelectric materials and modes selected to achieve such power density and efficiency characteristics.

While certain aspects and embodiments of the present disclosure are described in terms of PRs, the techniques and structures sought to be protected herein may also be applied to PTs (e.g., designs with multiple electrical ports) through the use of additional electrodes.

According to one aspect of the disclosure, a power converter having a specified voltage $V_{in}$ and a specified power level $P_{out}$ can comprise: a piezoelectric resonator (PR) configured for energy transfer between an input and an output of the converter. The PR can have an area A, a distance $l$ between first and second electrodes of the PR, and a dimensions value G defined as $$G = G_f \frac{A}{l} = \frac{B}{B_o}$$

where $G_f$ is a geometry-dependent factor of a frequency at which acoustic waves travel through the PR, B is proportional to an operating frequency of the PR times a capacitance of the PR, $B_o$ is a geometry-normalized representation of B. The PR may satisfy the following conditions for the specified $V_{in}$ and $P_{out}$:

1. G is substantially equal to $$\hat{G} = \frac{P_{out}}{V_{in}^2 B_o},$$

and
2. $l$ is substantially equal to $$\hat{l} = 2\pi \frac{B_o V_{in}}{I_{Lmaxo}},$$

where $I_{Lmaxo}$ is an amplitude of resonance of the PR.

In some embodiments, wherein G may be equal to $\hat{G}$ within 10%. In some embodiments, G may be equal to $\hat{G}$ within 20%. In some embodiments, $l$ may be equal to $\hat{l}$ within 10%. In some embodiments, $l$ may be equal to $\hat{l}$ within 20%.

In some embodiments, $P_{out}$ is either a rated power output or a typical power output of the power converter for a given input voltage. In some embodiments, $I_{Lmaxo}$ may correspond to a geometry-normalized maximum of $I_{Lmax}$, and $I_{Lmax}$ is an amplitude of resonance of the PR at $P_{out}$ for a given input voltage. In some embodiments, $G_f$ can correspond to a frequency-setting dimension as defined in the following:

$$f = \frac{\kappa}{2\pi} v_a = G_f \frac{\kappa_o}{2\pi} v_a,$$

in which in which $f$ is a frequency at which acoustic waves travel through the PR, $\kappa$ is a wave number of the PR, and $v_a$ is an acoustic velocity of the PR.

In some embodiments, the PR is configured to operate in at least one of: a perpendicular vibration mode; a parallel vibration mode; a shear vibration mode; or a length extensional mode. In some embodiments, the perpendicular vibration mode includes at least one of: a length extensional mode; a thickness shear mode; a contour extensional mode; or a radial mode. In some embodiments, the parallel vibration mode includes at least one of: a length extensional mode; a thickness extensional mode; and a thickness shear. In some embodiments, the PR is one of a plurality of PRs comprised within the power converter, wherein at least two of the plurality of PRs are configured to operate in a length extensional mode in parallel.

In some embodiments, the power converter can further comprise: a plurality of switches configured to operate in accordance with one or more switching sequences to transfer energy between the input and output of the converter via the PR; and a controller for controlling the switching sequences. In some embodiments, ones of the one or more switching sequences include a sequence of voltages to be applied to the PR, wherein ones of the voltages can include $V_{in}$, $-V_{in}$, $V_{in}-V_{out}$, $V_{out}-V_{in}$, $V_{out}$, $-V_{out}$, or Zero, where $V_{in}$ and $V_{out}$ correspond to the input and output voltage of the converter in that order or in reverse order, and Zero corresponds to the PR being short-circuited. In some embodiments, the switching sequences include at least one of: $V_{in}-V_{out}$, Zero, $V_{out}$; $V_{in}$, $V_{in}-V_{out}$, $V_{out}$; or $V_{in}$, $V_{in}-V_{out}$, Zero, $V_{out}$. In some embodiments, the switching sequences include at least one of: $V_{in}$, Zero, $V_{out}-V_{in}$; in $V_{out}-V_{in}$, $V_{out}$; or $V_{in}$ Zero $V_{out}-V_{in}$, $V_{out}$.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures.

DETAILED DESCRIPTION

Figure 1:
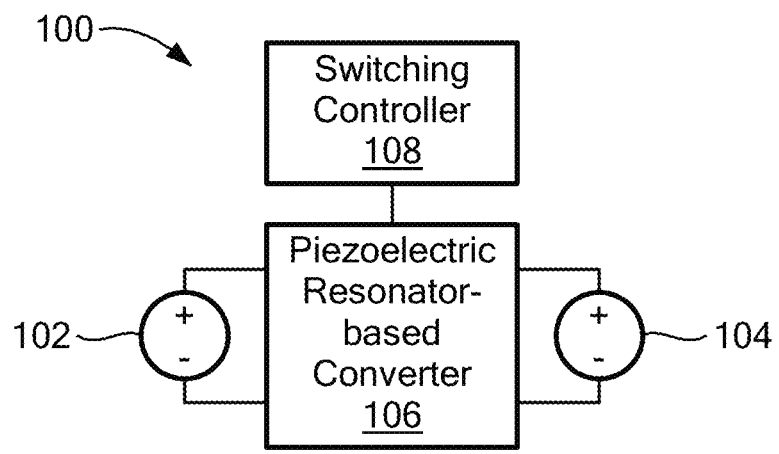
FIG. 1 is a block diagram of a system including a dc-dc converter based on a piezoelectric resonator (PR), according to some embodiments.

Referring to FIG. 1, an illustrative system 100 can include an input voltage 102, an output voltage 104, a dc-dc converter 106 disposed between the input and output voltages, and a switching controller 108, according to some embodiments. Output voltage 104 may correspond to a voltage source load. Converter may be provided as a step-up or step-down converter.

Converter 106 can include one or more piezoelectric resonators (PRs) and one or more switches arranged in given topology to selectively couple the input and output voltages 102, 104 to the PR electrodes. The one or more PRs may comprise all, or substantially all, of the energy transfer components of converter 106. For example, converter 106 may not include any capacitors, magnetics, or other energy storage components other than the one or more PRs. Thus, converter 106 may be referred to as a "PR-based" converter. Converter 106 can have one of the various PR-based converter topologies known in the art, including but not limited to any of the topologies shown and described in PCT Pat. App. No. PCT/US2020/037418, filed on Jun. 12, 2020, the entire contents of which are incorporated herein by reference. In some embodiments, the negative terminal of input voltage 102 may be coupled to the negative terminal of output voltage 104 (i.e., system 100 may be a common-negative system).

Switching controller 108 can include hardware and/or software configured to control switches within converter 106 according to one or more switching sequences. A switching sequence can be selected to provide low-loss soft charging of the PR capacitance.

Figure 10:
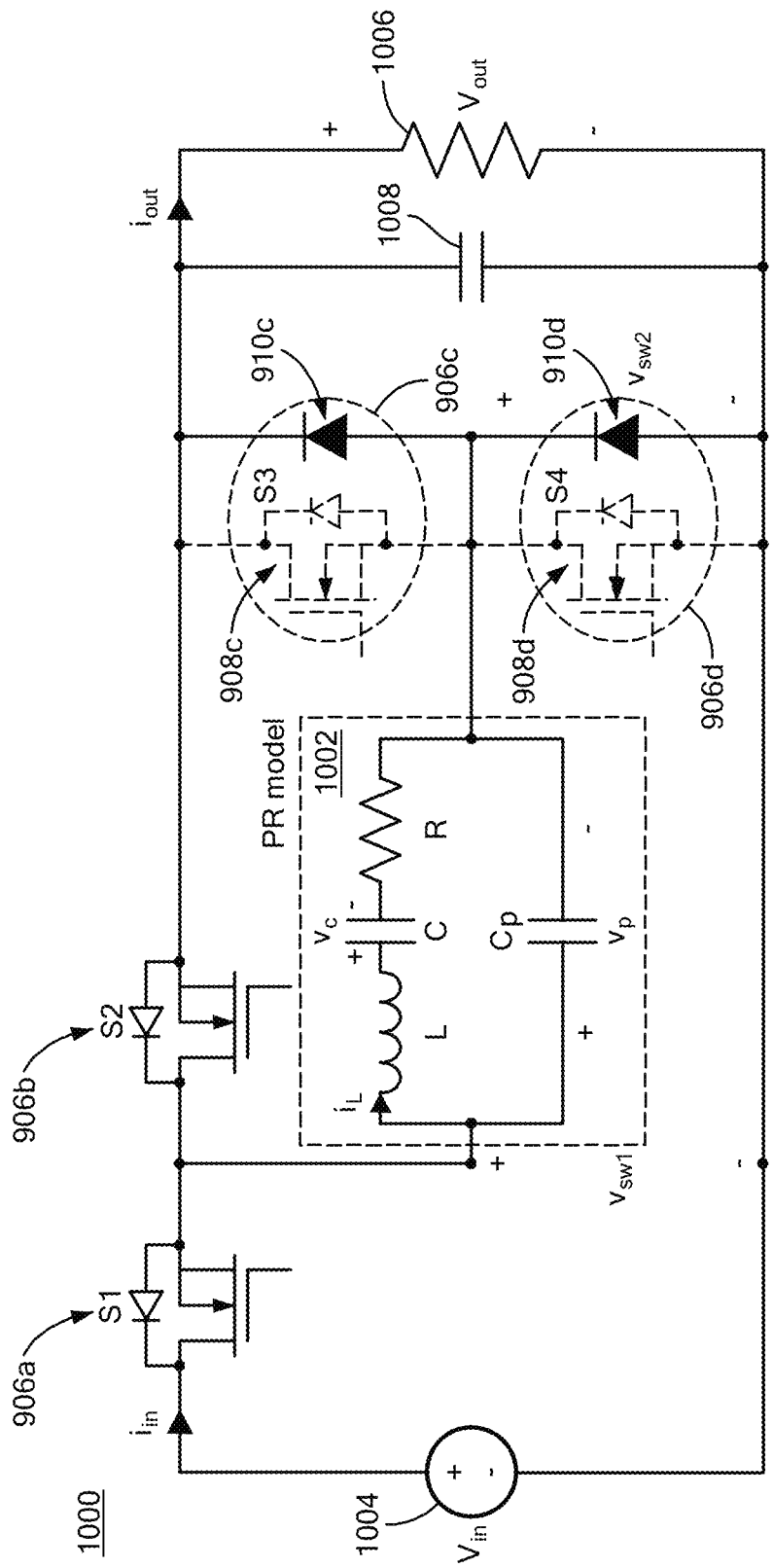
FIG. 10 is a circuit diagram showing an illustrative circuit for PR-based power conversion, according to the present disclosure.

In some embodiments, converter 106 can include a plurality of switches (such as illustrated in FIG. 10 and embodiments of PCT Pat. App. No. PCT/US2020/037418) configured to operate in accordance with one or more switching sequences to transfer energy between the input and output of the converter 106 via the PR. Controller 108 can control the switching sequences. In some embodiments, controller 108 can be provided as an application specific integrated circuit (ASIC).

A particular switching sequence can include a sequence of voltages to be applied to the PR, wherein ones of the voltages can include $V_{in}$, $-V_{in}$, $V_{in}-V_{out}$, $V_{out}-V_{in}$, $V_{out}$, $-V_{out}$, Zero, or Open, where $V_{in}$ and $V_{out}$ correspond to the input and output voltage of the converter in that order or in reverse order, Zero corresponds to the PR being short-circuited, and Open corresponds to the PR being open-circuited.

In some embodiments, the switching sequences include at least one of: $V_{in}-V_{out}$, Zero, $V_{out}$; $V_{in}$, $V_{in}-V_{out}$, $V_{out}$; or $V_{in}$, $V_{in}$–$V_{out}$, Zero, $V_{out}$. Such sequences may be efficient for use in a step-down converter (i.e., where $V_{in}$>$V_{out}$).

In some embodiments, the switching sequences include at least one of: $V_{in}$, Zero, $V_{out}$–$V_{in}$; $V_{in}$, $V_{out}$–$V_{in}$, $V_{out}$; or $V_{in}$, Zero $V_{out}$–$V_{in}$, $V_{out}$. Such sequences may be efficient for use in a step-up converter (i.e., where $V_{in}$<$V_{out}$).

Various other examples of switching sequences that can be implemented within controller 108 are described in PCT Pat. App. No. PCT/US2020/037418.

In some embodiments, PR-based converter 106 can include a PR having a perpendicular vibration mode, a parallel vibration mode, a shear vibration mode, and/or a length extensional mode. Perpendicular vibration modes can provide high volumetric energy handling densities and extremely planar shapes. Perpendicular vibration modes can include length extensional (with side electrodes), thickness shear (with end electrodes), contour extensional, and radial modes. Parallel vibration modes can provide high areal power handling densities and less-extreme planar shapes. Parallel vibration modes can include length extensional (with end electrodes), thickness extensional, and thickness shear (with side electrodes). Shear vibration modes (with side or end electrodes) can provide high mechanical efficiency and high areal power density. Length extensional mode (with end electrodes), also referred to as $k_{33}$ mode, can provide high mechanical efficiency and high areal power density for very low power applications. In some embodiments, multiple PRs of this mode may be utilized in parallel to multiply power capability.

In terms of materials, lithium niobate can provide highly planar shapes operating at higher switching frequencies (e.g., compared to PZT) for the same volumetric power density. Lithium niobate shear modes combine the advantages of lithium niobate and shear modes, providing high mechanical efficiency, high areal power density, extremely planar shapes, operating at higher switching frequencies for a given volumetric power density. The shear mode can have either side or end electrodes, creating a parallel or perpendicular shear vibration mode. Lithium niobate shear-mode cuts may include 41-degree X-cut, 163-degree rotated Y-cut, and 10-degree rotated Y-cut. PZT can provide less-extreme planar shapes operating at lower switching frequencies (e.g., compared to lithium niobate) for the same volumetric power density. PZT shear modes combine the advantages of PZT and shear modes, providing high mechanical efficiency, high areal power density, less-extreme planar shapes, operating at lower switching frequencies for a given volumetric power density. The shear mode can have either side or end electrodes, creating a parallel or perpendicular shear vibration mode.

In some embodiments, PR-based converter 106 can include a PR having a geometric configuration that provides improved, and ideally maximum, efficiency at a nominal operating point (i.e., voltage and load) by satisfying G in equation (17) herein, with mode dependent parameters and values as defined in Table 5 and elsewhere herein. In other words, the actual value G for the PR may be substantially equal to the ideal value Ĝ (for maximum efficiency) calculated using equation (17) for the input/output voltage $V_{in}$ and power level $P_{out}$ specified for the converter 106. In some cases, $P_{out}$ may be either a rated power output or a typical power output of the converter 106 for a given input voltage, $V_{in}$.

In some embodiments, PR-based converter 106 can include a PR having a geometric configuration that provides improved, and ideally maximum, power density at a nominal operating point by satisfying l in equation (25) herein, with mode dependent parameters and values as defined in Tables 4 and 5, and elsewhere herein. In other words, the actual value l for the PR may be substantially the same as the ideal value l̂ calculated using equation (25) for the specified voltage $V_{in}$ and power level $P_{out}$. The power density may be limited by maximum loss density $$\left(\frac{P_{loss,max}}{A_s}\right),$$

maximum electric field ($E_{max}$), maximum mechanical stress ($T_{max}$), or maximum mechanical strain ($S_{max}$).

In some embodiments, PR-based converter 106 may be configured to "substantially" satisfy the geometry conditions of equations (17) and/or (25). For example, PR-based converter 106 may be configured to satisfy the condition of equation (17) and/or of equation (25) within 1%, 2%, 5%, 10%, 15%, 20%, 25%, etc.

In some embodiments, PR-based converter 106 can include a PR having a geometric configuration that provides both improved/maximum efficiency and power density at a nominal operating point by simultaneously satisfying G and l in equations (17) and (25) based on the geometry- and material-dependent parameters as described herein. Table 7 of this disclosure provides illustrative design selections and anticipated performance for different modes and materials based on available material parameters.

In some embodiments, switching controller 108 can be configured to operate/control the PR-based converter 106 according to techniques described hereinbelow. For example, in some embodiments, PR-based converter 106 can be operated with a switching frequency similar to that described by equation (20) below to achieve improved, and ideally maximum, efficiency.

Figure 1A:
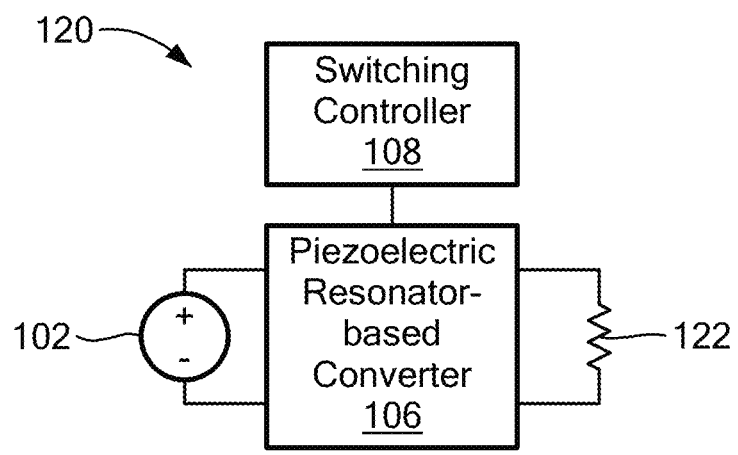
FIG. 1A is a block diagram of another system including a PR-based converter, according to some embodiments.

Referring to FIG. 1A, according to another embodiment, a system 120 can include a PR-based converter 106 coupled between an input voltage 102 and a resistive load 122. That is, embodiments of the PR-based converters disclosed herein can be used within systems having voltage source loads, as in FIG. 1, and within systems having resistive loads, as in FIG. 1A.

Before describing various embodiments of the disclosure, various material state definitions are introduced in Table 1, and various material property definitions are introduced in Table 2.

TABLE 1

Material State Definitions

| | |
|---|---|
| u | Mechanical Displacement (m) |
| T | Mechanical Stress (N/m²) |
| S | Mechanical Strain |
| E | Electric Field Strength (N/m) |
| D | Electric Flux Density (C/m²) |

TABLE 2

Material Property Definitions

| | |
|---|---|
| $Q_m$ | Mechanical Quality Factor |
| k | Electromechanical Coupling Factor |
| $v_a$ | Acoustic Velocity (m/s) |
| ρ | Mass Density (kg/m³) |
| ε | Dielectric Constant (F/m) |
| s | Compliance Constant (m²/N) |

TABLE 2-continued

Material Property Definitions

| | |
|---|---|
| d | Piezoelectric Charge Constant (C/N) |
| c | Elastic Modulus (N/m²) |
| e | Piezoelectric Strain Modulus (C/m²) |
| σ | Poisson's Ratio |
| $T_{max}$ | Maximum Mechanical Stress (N/m²) |
| $S_{max}$ | Maximum Mechanical Strain |
| $E_{max}$ | Max. Electric Field Strength (N/m) |

2. Piezoelectric Resonator Model

Turning to FIGS. 2A-2G, PRs can be produced in a variety of shapes and electrode patterns, and each configuration has a unique set of compatible vibration modes depending on the PR's polarization direction, electrode placement, and boundary conditions. FIGS. 2A-2G shows various different PR vibration modes, with electrodes denoted by shaded areas, displacement direction(s) marked with arrows, and nodes/nodal planes marked with dashed lines. The polarization direction of the PR is denoted with "P", and each electrode is assumed to have area A with distance 2l between electrodes. All surfaces are assumed to have no externally-applied stress (i.e., all surfaces are traction-free), and the origin is assumed to be at the PR's center for analysis in Appendix A.

To derive power conversion metrics for piezoelectric materials, focus can be directed to the fundamental frequencies of the vibration modes displayed in FIGS. 2A-2G. These vibration modes can be grouped into two categories that permeate throughout this disclosure: modes for which the applied and induced electric fields are parallel (∥), and modes for which these fields are perpendicular (+).

Figure 2A:
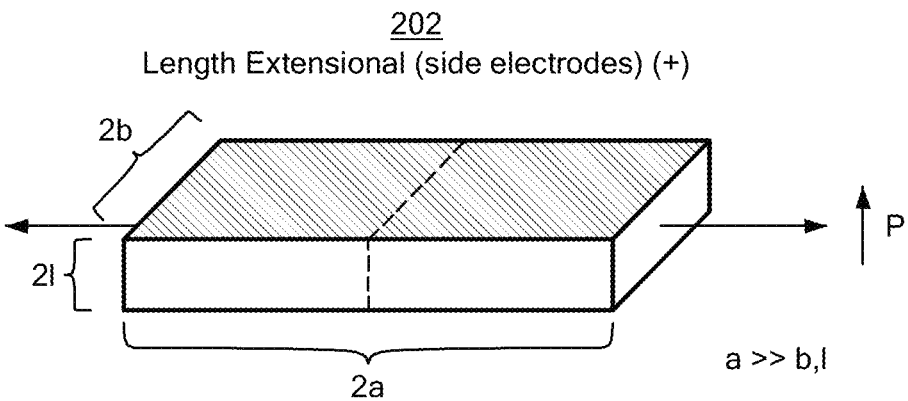
FIGS. 2A-2G shows examples of PR vibration modes that can be used within a PR-based converter, according to some embodiments.
Figure 2B:
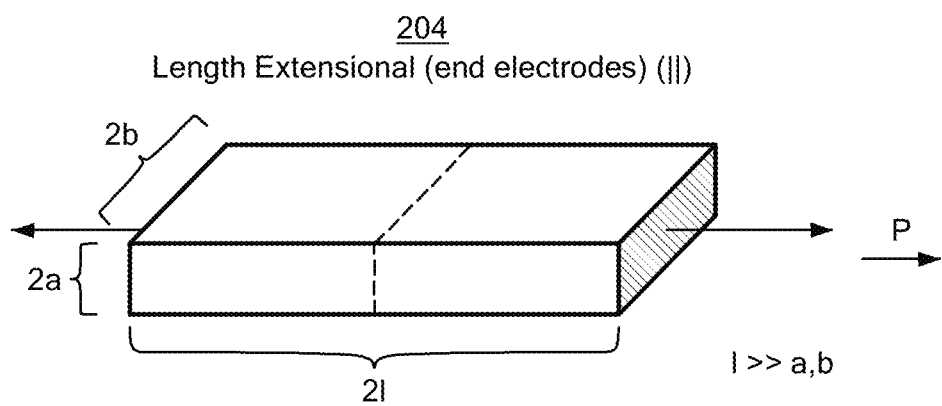
Figure 2C:
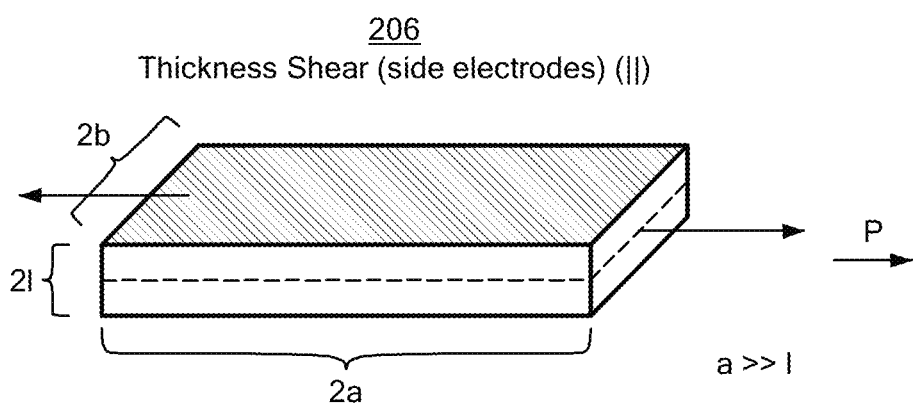
Figure 2D:
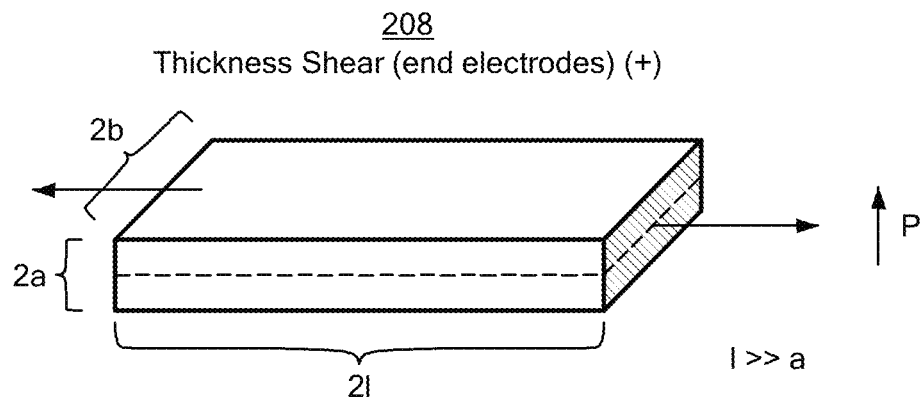
Figure 2E:
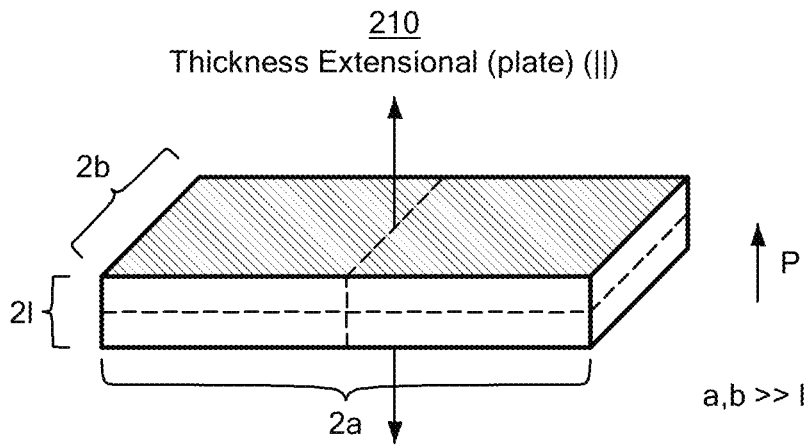
Figure 2F:
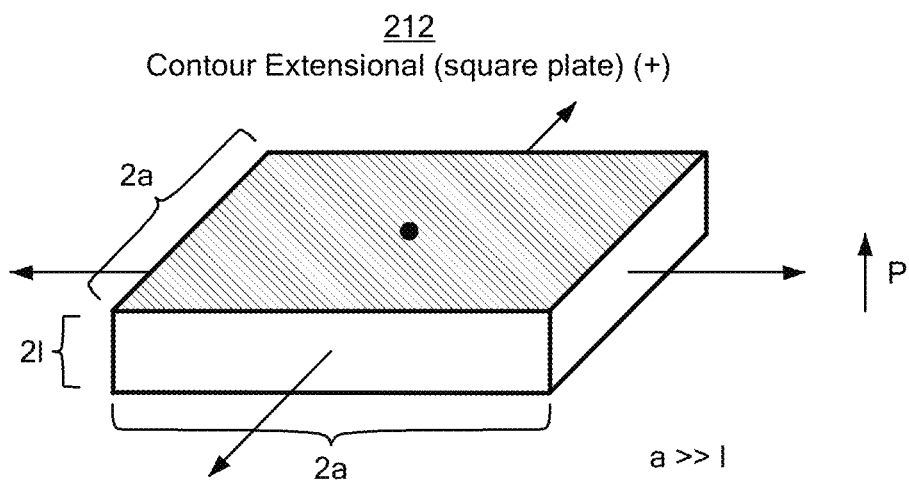
Figure 2G:
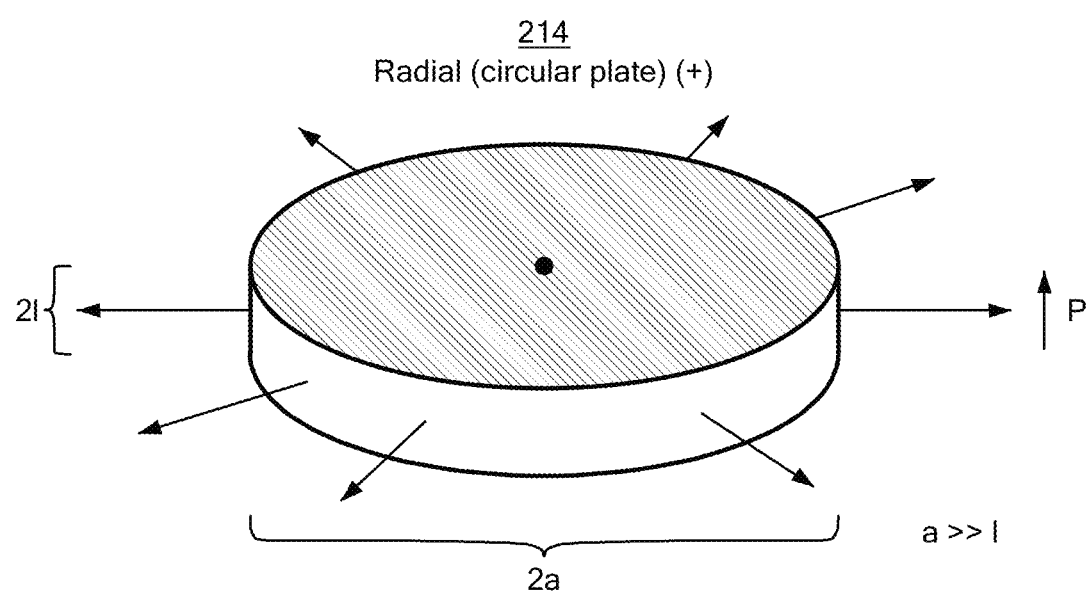

FIG. 2A shows a length extensional mode 202 with side electrodes and perpendicular (+) fields. FIG. 2B shows a length extensional mode 204 with end electrodes and parallel (∥) fields. FIG. 2C shows a thickness shear mode 206 with side electrodes and parallel (∥) fields. FIG. 2D shows a thickness shear mode 308 with end electrodes and perpendicular (+) fields. FIG. 2E shows a thickness extensional (plate) mode 210 having parallel (∥) fields. FIG. 2F shows a contour extensional (square plate) mode 212 having perpendicular (+) fields. FIG. 2G shows a radial (circuit plate) mode 214 having perpendicular (+) fields.

Deriving power conversion metrics for piezoelectric materials first requires appropriate models for a PR's mechanical and electrical behaviors. Piezoelectric materials are governed by coupled constitutive relations between mechanical strain (S), mechanical stress (T), electric field strength (E), and electric flux density (D) due to the direct and converse piezoelectric effects:

$$S_{ij} = \frac{1}{2}\left(\frac{\partial u_i}{\partial x_j} + \frac{\partial u_j}{\partial x_i}\right) = s^E_{ijmn}T_{mn} + d_{mij}E_m \quad (1)$$

$$D_i = d_{imn}T_{mn} + \varepsilon^T_{im}E_m \quad (2)$$

States and parameters for these equations are defined in Tables 1 and 2, wherein superscripts indicate constant conditions for measurement, and indices designate tensor components. Combined with the Newtonian equation of motion, (1) and (2) reduce to an acoustic wave equation that dictates sinusoidal time- and space-dependent solutions for u, S, T, and E; this is described with more detail in Appendix 10.

With all surfaces in FIGS. 2A-2G assumed to be traction-free, the maximum amplitudes of S, T, and E each occur at the center of the PR.

TABLE 3

Piezoelectric Resonator Model Parameters

| Parameter | Parallel (∥) | Perpendicular (+) |
|---|---|---|
| $G_f$ | $\dfrac{1}{l}$ | $\dfrac{1}{a}$ |
| $Y_o$ | $\sqrt{\pi^2 - 8k^2}$ | $\sqrt{\pi^2 + 8\dfrac{k^2}{1-k^2}}$ |
| $C_p$ | $\varepsilon^T(1-k^2)\dfrac{A}{2l}$ | $\varepsilon^T(1-k^2)\dfrac{A}{2l}$ |
| C | $\dfrac{8k^2}{\pi^2 - 8k^2}C_{p\parallel}$ | $\dfrac{8k^2}{\pi^2(1-k^2)}C_{p+}$ |
| L | $\dfrac{1}{2G_f^2 k^2 v_a^2 C_{p\parallel}}$ | $\dfrac{1-k^2}{2G_f^2 k^2 v_a^2 C_{p+}}$ |
| R | $\dfrac{1}{Q_m}\sqrt{\dfrac{L_\parallel}{C_\parallel}}$ | $\dfrac{1}{Q_m}\sqrt{\dfrac{L_+}{C_+}}$ |

Additional radial mode model parameters are shown in Appendix 10(c).

The frequency $f$ of the acoustic wave propagating through the PR is expressed as:

$$f = \frac{\kappa}{2\pi}v_a = G_f \frac{\kappa_o}{2\pi}v_a \quad (3)$$

in which κ is the wave number (in rad/m) and $v_a$ is the acoustic velocity (in m/s) of the PR material. Herein, $\kappa_o$ is defined to be the geometry-normalized wave number (in rad), from which the geometry-dependent factor $G_f$ is extracted. $G_f$ is different for parallel and perpendicular vibration modes and is displayed for each in Table 3; as observed in equation (3), it is proportional to the resonant frequency of the PR.

In some embodiments, mounting and/or contacts can be placed at nodes and/or at nodal planes as illustrated in FIGS. 2A-2G to mitigate loss and damping. Electrode patterning (e.g., using a mesh-patterned electrode, a backbone-and-rib pattern, etc.) can be used to provide required electrical distribution while mitigating mechanical loss for the desired operating mode of a design.

Figure 3:
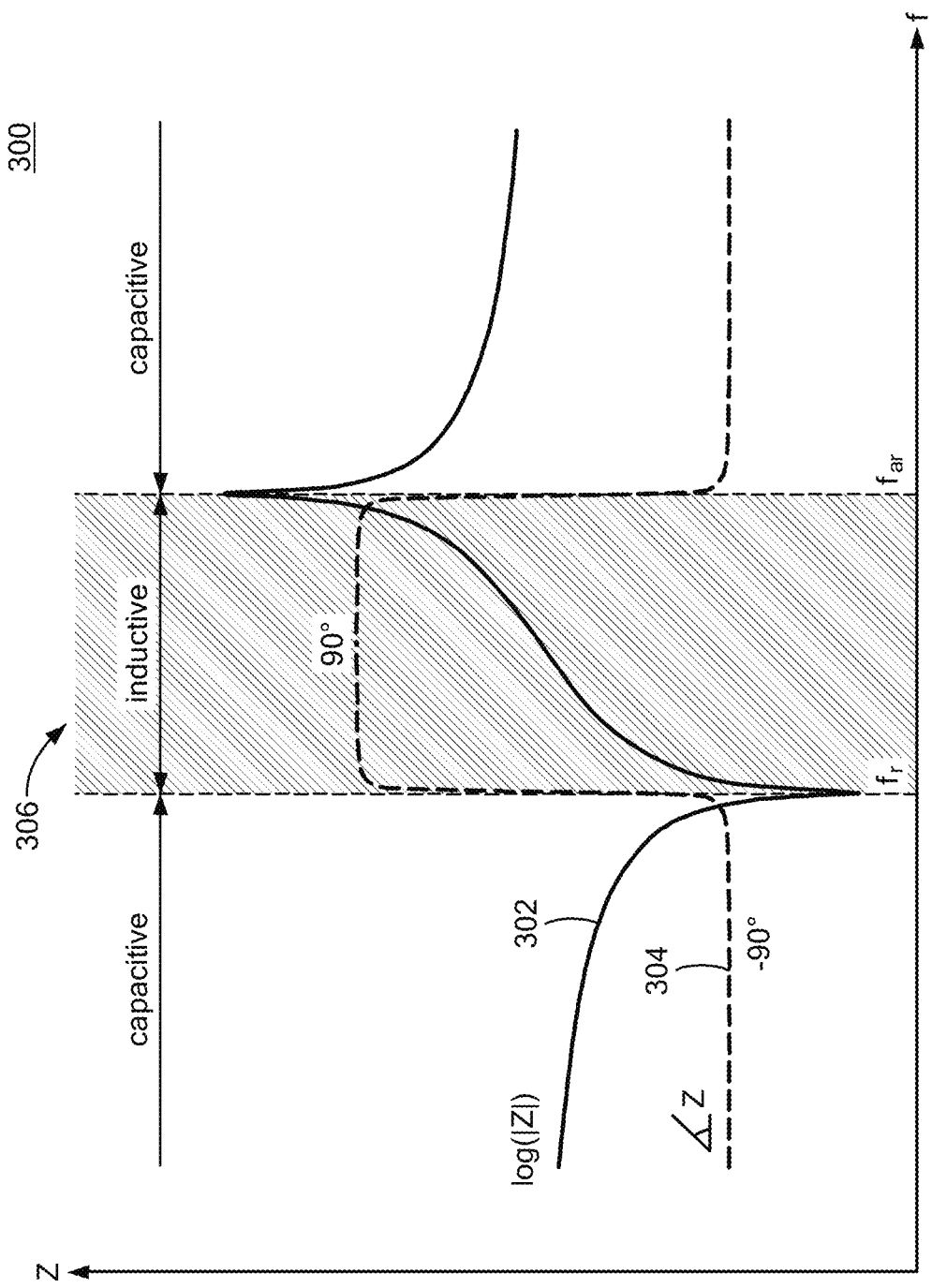
FIG. 3 is a plot illustrating PR impedance magnitude and phase in the proximity of a vibration mode.

Turning to FIG. 3, the PR's electrical impedance can be likewise derived from the acoustic wave solution as a function of $f$. FIG. 3 is a plot 300 showing PR impedance magnitude 302 and phase 304 in the proximity of a vibration mode, where $f_r$ is the resonant frequency and $f_{ar}$ is the anti-resonant frequency. The PR exhibits inductive behavior in the region 306 between the resonant ($f_r$) and anti-resonant ($f_{ar}$) frequencies; this region is of most interest to power conversion since it enables zero voltage switching and other high-efficiency behaviors. The inductive region 306 spans the following ranges of $\kappa_o$ for parallel (∥) and perpendicular (+) vibration modes, respectively:

$$\frac{\gamma_{o\parallel}}{2} < \kappa_{o\parallel} < \frac{\pi}{2} \quad (4)$$

$$\frac{\pi}{2} < \kappa_{o+} < \frac{\gamma_{o+}}{2} \quad (5)$$

for which factor $\gamma_o$ is displayed in Table 3.

Figure 4:
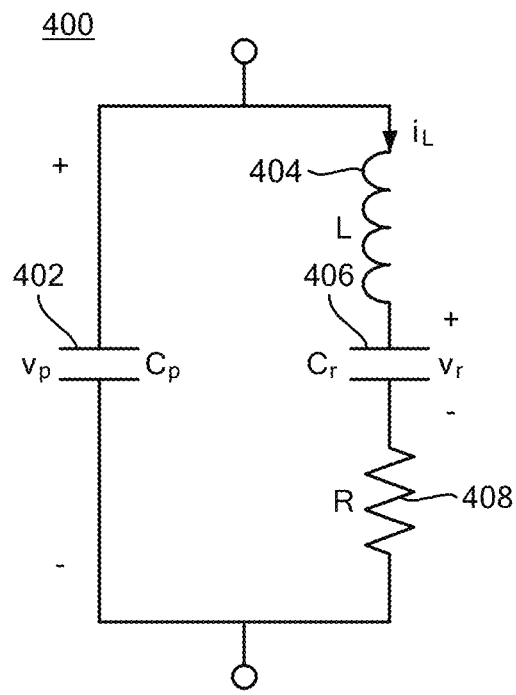
FIG. 4 is a circuit diagram showing a Butterworth-Van Dyke circuit model for PRs.

Turning to FIG. 4, the PR impedance characteristic shown in FIG. 3 can be modeled by an equivalent electrical circuit (i.e., the Butterworth-Van Dyke model) as illustrated in FIG. 4. Illustrative circuit model 400 includes a first capacitor 402 ($C_p$) to model the PR's physical electrical capacitance and an LCR branch including an inductor 404 (L), a second capacitor 406 (C), and a resistor 408 (R) to model the PR's electromechanical resonance properties.

For excitation of a PR's fundamental frequency, the circuit model 400 can have the parameters shown in Table 3, which are generalized to parallel and perpendicular vibration modes. A is the electrode area, 2l is the distance between the electrodes, and the material parameters of interest are shown for each vibration mode in Appendix A. This electrical model serves as a basis for conceptualizing the PR's behavior: $f_r$ corresponds to series resonance between L and C, and $f_{ar}$ occurs at parallel resonance between $C_p$ and the series combination of L and C.

The model's full derivation for all considered modes can be found in J. Erhart, P. Pulpan, and M. Pustka, "Piezoelectric Ceramic Resonators," Springer, 2017; and J. D. Boles, P. L. Acosta, Y. K. Ramadass, J. H. Lang, and D. J. Perreault, "Evaluating piezoelectric materials for power conversion." in "Proc. IEEE Workshop on Control and Modeling for Power Electronics," Aalborg, Denmark, November 2020, pp. 1-8 ("Perreault et al.") provides this derivation for the length extensional mode. The vibration mode analyzed in Perreault et al. is referred to as the thickness extensional mode, though it assumes the $k_{33}$ coupling coefficient. Thus, the analysis in Perreault et al. corresponds to this disclosure's length extensional mode with end electrodes (e.g., mode 204 illustrated in FIG. 2B) analysis, except with one electrode solidly mounted.

3. Amplitude of Resonance Model

The circuit model described in Section 2 can be employed to analyze the PR's behavior in a power converter (e.g., within converter 106 of FIG. 1). Because PRs tend to have very high quality factors in the proximity of their resonant frequencies, $i_L$ can be assumed to be sinusoidal. The amplitude of $i_L$ ($I_L$) then provides insight into the amplitude of the PR's mechanical resonance, which dictates its mechanical energy storage and loss.

A. Model Introduction

Figure 5:
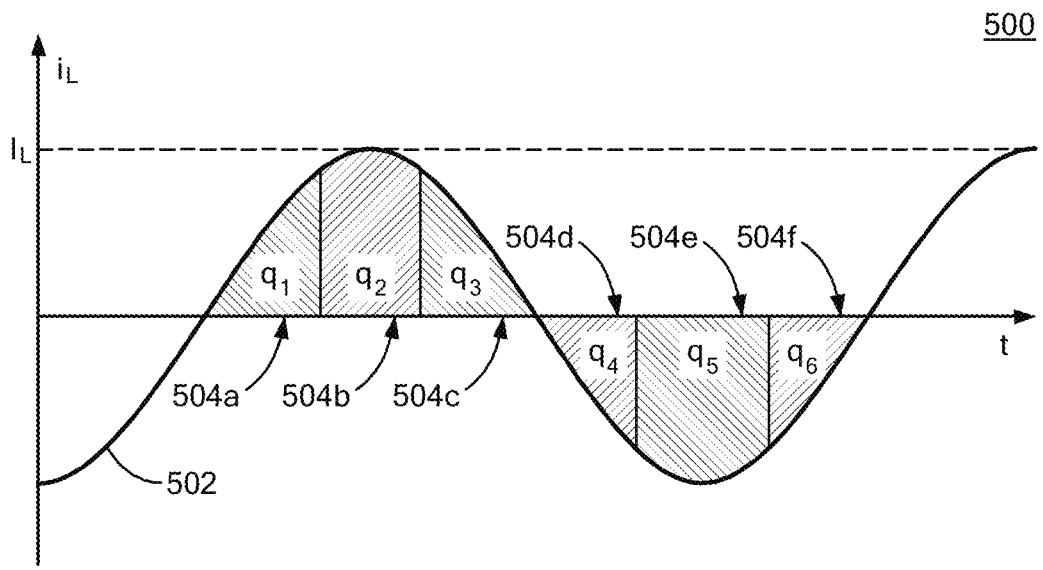
FIG. 5 is a plot illustrating a sinusoidal approximation of $i_L$ and resulting resonance amplitude based on the charge transfer required of each of several switching stages.

Turning to FIG. 5, the PR's ideal amplitude of resonance can be calculated from the total magnitude of charge it transfers via $i_L$ during each resonant cycle, as shown, which depends on the converter's specific switching sequence and operating point. FIG. 5 is a plot 500 showing a sinusoidal approximation 502 of $i_L$ (and resulting amplitude of resonance $I_L$) based on the charge transfer $q_n$ required of each switching stage n (e.g., within the six stages labeled 504a-504f). See J. D. Boles, J. P. Piel, and D. J. Perreault., "Enumeration and analysis of dc-dc converter implementations based on piezoelectric resonators," in "IEEE Transactions on Power Electronics," vol. 36, no. 1. pp. 129-145, 2021 ("Boles et al.").

To provide an accurate representation of the PR's behavior as used in a converter, this charge transfer calculation includes both the "connected/zero stages" (i.e., stages when the PR is connected to the source-load system) and "open stages" (stages when the PR is open-circuited and $C_p$ charges/discharges through resonance) of the switching sequence.

To evaluate piezoelectric materials, either of the highest-efficiency step-down switching sequences analyzed in Boles et al. can be assumed, which have the following $I_L$:

$$I_L = \frac{\pi}{2} f Q_{total} = \pi\left(\frac{P_{out}}{V_{in}} + f C_p V_{in}\right) \quad (6)$$

In accordance with the switching sequences proposed in Boles et al., this $I_L$ equation assumes resonant "soft" charging/discharging of the PR's $C_p$, zero voltage switching of all switches, and all-positive instantaneous power transfer for high efficiency. Thus, equation (6) models the PR's amplitude of resonance for quintessential converter operation, which is assumed throughout this disclosure.

B. Material Limits

The maximum permissible $I_L$ for a given PR may be set by its material's limits for strain ($S_{max}$), stress ($T_{max}$), and electric field ($E_{max}$). Such potential limits include yield stress and strain, as well as depolarization field (often referred to as "coercive" field). The relationship between $I_L$ and the PR's physical states can be derived using the constitutive relations of equations (1)-(2) and the equation of motion. It should be noted that $V_{in}$ in equation (22) is the converter's input voltage, and that the voltage exposed to the PR is not purely sinusoidal. Thus, $V_{in}$ cannot be directly affixed to physical limits like $T_{max}$ and $E_{max}$. This results in the following relationship between $I_L$ and the amplitude of mechanical displacement (A) as derived in Appendix B:

$$I_L = \kappa A G_f \frac{v_a d}{s^E} A \sin(\kappa_o) \quad (7)$$

Then, S, T and E can each be related to $I_L$ through $\Delta$. This strategy can be utilized to determine the amplitudes of resonance that correspond to maximum strain ($I_{LmaxS}$), maximum stress ($I_{LmaxT}$), and maximum E field ($I_{LmaxE}$) as demonstrated in Appendix B. It is shown that $I_{LmaxS}$, $I_{LmaxT}$, and $I_{LmaxE}$ have identical geometry terms, so their geometry-normalized limits (referred to as $I_{LmaxSo}$, $I_{LmaxTo}$ and $I_{LmaxEo}$, respectively) are summarized for each considered vibration mode in Table 4.

TABLE 4

Maximum Amplitudes of Resonance Based on Material Limits

| Vibration Mode | $I_{LmaxSo}$ | $I_{LmaxTo}$ | $I_{LmaxEo}$ | $I_{LmaxLo}$ |
|---|---|---|---|---|
| Length Extensional (s) | $v_a \frac{d_{31}}{s_{11}^E} S_{max} \sin(\kappa_o)$ | $v_a d_{31} T_{max} \cot\left(\frac{\kappa_o}{2}\right)$ | $v_a k_{31}^2 \varepsilon_{33}^T E_{max} \tan(\kappa_o)$ | $\sqrt{\frac{4 Q_m k_{31}^2 \varepsilon_{33}^T v_a}{\pi}} H$ |

TABLE 4-continued

Maximum Amplitudes of Resonance Based on Material Limits

| Vibration Mode | $I_{LmaxSo}$ | $I_{LmaxTo}$ | $I_{LmaxEo}$ | $I_{LmaxLo}$ |
|---|---|---|---|---|
| Length Extensional (e) | $v_a \dfrac{d_{33}}{s_{33}^E} S_{max}\sin(\kappa_o)$ | $v_a d_{33}(1-k_{33}^2)T_{max}\cot\left(\dfrac{\kappa_o}{2}\right)$ | $v_a k_{33}^2 \varepsilon_{33}^S E_{max}\dfrac{\sin(\kappa_o)}{\cos(\kappa_o)-k_{33}^2}$ | $\sqrt{\dfrac{4Q_m k_{33}^2 \varepsilon_{33}^S v_a}{\gamma_o}H}$ |
| Thickness Shear (side) | $v_a \dfrac{d_{15}}{s_{55}^E} S_{max}\sin(\kappa_o)$ | $v_a d_{15}(1-k_{15}^2)T_{max}\cot\left(\dfrac{\kappa_o}{2}\right)$ | $v_a k_{15}^2 \varepsilon_{11}^S E_{max}\dfrac{\sin(\kappa_o)}{\cos(\kappa_o)-k_{15}^2}$ | $\sqrt{\dfrac{4Q_m k_{15}^2 \varepsilon_{11}^S v_a}{\gamma_o}H}$ |
| Thickness Shear (end) | $v_a \dfrac{d_{15}}{s_{55}^E} S_{max}\sin(\kappa_o)$ | $v_a d_{15} T_{max}\cot\left(\dfrac{\kappa_o}{2}\right)$ | $v_a k_{15}^2 \varepsilon_{11}^T E_{max}\tan(\kappa_o)$ | $\sqrt{\dfrac{4Q_m k_{15}^2 \varepsilon_{11}^T v_a}{\pi}H}$ |
| Thickness Extensional | $v_a e_{33} S_{max}\sin(\kappa_o)$ | $v_a \dfrac{e_{33}(1-k_t^2)}{c_{33}^E} T_{max}\cot\left(\dfrac{\kappa_o}{2}\right)$ | $v_a k_t^2 \varepsilon_{33}^S E_{max}\dfrac{\sin(\kappa_o)}{\cos(\kappa_o)-k_t^2}$ | $\sqrt{\dfrac{4Q_m k_t^2 \varepsilon_{33}^S v_a}{\gamma_o}H}$ |
| Contour Extensional | $\dfrac{2d_{31}v_a}{s_{11}^E(1-\sigma)} S_{max}\sin(\kappa_o)$ | $2v_a d_{31} T_{max}\cot\left(\dfrac{\kappa_o}{2}\right)$ | $v_a k_p^2 \varepsilon_{33}^T E_{max}\tan(\kappa_o)$ | $\sqrt{\dfrac{4Q_m k_p^2 \varepsilon_{33}^S v_a}{\pi}H}$ |
| Radial | $\dfrac{4d_{31}v_a}{s_{11}^E(1-\sigma)} S_{max}J_1(\kappa_o)$ | $\dfrac{2v_a d_{31}(1+\sigma)}{\tfrac{1}{2}(1+\sigma)-\Psi} T_{max}J_1(\kappa_o)$ | $v_a k_{33}^2 \varepsilon_{33}^T (1+\sigma)E_{max}\dfrac{J_1(\kappa_o)}{\Psi}$ | $\sqrt{\dfrac{2Q_m k_p^2 \varepsilon_{33}^T v_a}{\dfrac{\kappa_{o,r}}{1+\sigma}-\dfrac{1-\sigma}{\kappa_{o,r}}}H}$ |

In Table 4, $$H = \left(\dfrac{P_{loss}}{A_s}\right)_{max}$$

is substituted for $I_{LmaxLo}$. For radial mode, Appendix 10(c) contains the definition for WY and series expansions for Bessel functions.

The lowest-magnitude limit can be considered the geometry-normalized maximum for $I_L$:

$$I_{Lmaxo} = \dfrac{I_{Lmax}}{AG_f} = \min(I_{LmaxSo}, I_{LmaxTo}, I_{LmaxEo}) \quad (8)$$

Thus, the geometry-normalized limit $I_{Lmaxo}$ (and which physical limit constrains it) can be determined based on only material parameters and limits. $I_{Lmaxo}$ is employed to determine maximum power handling density in Section 5.

C. Loss Density Limit

Thermal management limitations may confine a PR's amplitude of resonance to lower bounds than its material's physical limits, so an $I_L$ limit can be derived based on loss density. For this limit, assume that most PR heat extraction occurs through a surface with area $A_s$, and that a thermal design can safely accommodate a certain quantity of PR loss per $A_s$. This areal loss density relates to the PR's operation as follows, considering only mechanical loss as defined in equation (12):

$$\dfrac{P_{loss}}{A_s} = \dfrac{1}{2}\dfrac{I_L^2 R}{A_s} = \dfrac{1}{2}I_{Lo}^2 R_o \quad (9)$$

in which geometry parameters from $I_L$ and R have been extracted, assuming $A_s = A$ for parallel ($\parallel$) modes and $A_s = G_f A l$ for perpendicular ($\perp$) modes as defined in Table 6, and $R_o$ as defined in Table 5.

For contour extensional and radial modes (i.e., modes for which both non-1 dimensions are equal), $$\dfrac{P_{loss}}{A_s} = \dfrac{4}{\hat{G}}\dfrac{P_{loss}}{A}$$

may be used to scale a representative areal loss density based on A (assuming a PR design will adhere to the $\hat{G}$ condition for maximum efficiency as described in Section 4(b)). Since $\hat{G}$ varies by operating point, it should be noted that the resulting $I_{LmaxLo}$ would also depend on operating point information.

For these assumed surfaces, all geometry terms cancel and equation (9) shows a direct relationship between areal loss density and $I_{Lo}$. This equation can be rearranged to define a loss-limited maximum for $I_{Lo}$:

$$I_{LmaxLo} = \sqrt{\dfrac{2}{R_o}\left(\dfrac{P_{loss}}{A_s}\right)_{max}} \quad (10)$$

$I_{LmaxLo}$ is displayed in Table 4 for each mode and can be directly compared to $I_{LmaxSo}$, $I_{LmaxTo}$ and $I_{LmaxEo}$ in (8) to determine $I_{Lmaxo}$. It can also be utilized in Section 5 to calculate loss-limited energy and power handling densities.

4. Mechanical Efficiency Figure of Merit

To quantitatively compare piezoelectric materials and vibration modes for power conversion, focus can first be given to achievable PR efficiency; this has implications for both operating cost and thermal management. Efficiency can be expressed as $$\eta = \dfrac{P_{out}}{P_{out}+P_{loss}} = \dfrac{1}{1+\dfrac{P_{loss}}{P_{out}}} \quad (11)$$

Thus, the impact of piezoelectric material properties on efficiency can be examined through loss ratio $P_{loss}/P_{out}$, which is desired to be as low as possible. Material-dependent losses in the PR include mechanical loss and dielectric loss; since mechanical loss typically dominates close to resonance, this disclosure focuses on only mechanical loss for this FOM.

A. Minimum Mechanical Loss Ratio

To derive the minimum mechanical loss ratio for a piezoelectric material, mechanical loss can be estimated using the PR's amplitude of resonance as in equation (6) and resistance as follows:

$$P_{loss} = \frac{1}{2} I_L^2 R \quad (12)$$

$P_{loss}$ can then be divided by $P_{out}$ to produce the following mechanical loss ratio equation:

$$\frac{P_{loss}}{P_{out}} = \frac{\frac{1}{2} I_L^2 R}{P_{out}} = \frac{\pi^2}{2}\left(\frac{P_{out}}{V_{in}^2} R + 2BR + \frac{V_{in}^2 B^2}{P_{out}} R\right) \quad (13)$$

in which the following substitution is made:

$$B = fC_p \quad (14)$$

This loss ratio equation has only two operating point parameters ($V_{in}$ and $P_{out}$) and two PR-dependent parameters (B and R). The PR's material and geometry properties can be explicitly separated by extracting all geometry parameters from B and R, which have the same lumped geometry term G (as reciprocals), leaving only the material-dependent $B_o$ and $R_o$, respectively. Thus, equation (13) can be rewritten as $$\frac{P_{loss}}{P_{out}} = \frac{\pi^2}{2}\left(\frac{P_{out}}{V_{in}^2}\frac{R_o}{G} + 2B_o R_o + \frac{V_{in}^2}{P_{out}} GB_o^2 R_o\right) \quad (15)$$

where $$G = G_f \frac{A}{l} = \frac{B}{B_o} = \frac{R_o}{R} \quad (16)$$

These parameters are displayed for each vibration mode in Table 5. It should be noted that $Q_m$ is treated as a material property provided by the manufacturer for the purposes of this study, though $Q_m$ may vary from this value based on PR shape, vibration mode, and mounting structure.

TABLE 5

Mechanical Efficiency Figures of Merit and Relevant Parameters

| Vibration Mode | G | $B_o$ | $R_o$ | $FOM_M$ | $\gamma_o$ |
|---|---|---|---|---|---|
| Length Extensional (s) | $\frac{4b}{l}$ | $\varepsilon_{33}^T(1-k_{31}^2)\frac{\kappa_o v_a}{4\pi}$ | $\frac{\pi}{2Q_m k_{31}^2 \varepsilon_{33}^T v_a}$ | $4Q_m \frac{k_{31}^2}{1-k_{31}^2}\frac{1}{\pi^2 \bar{\kappa}_o}$ | $\sqrt{\pi^2 + 8\frac{k_{31}^2}{1-k_{31}^2}}$ |
| Length Extensional (e) | $\frac{A}{l^2}$ | $\varepsilon_{33}^T(1-k_{33}^2)\frac{\kappa_o v_a}{4\pi}$ | $\frac{\gamma_o}{2Q_m k_{33}^2 \varepsilon_{33}^T(1-k_{33}^2) v_a}$ | $4Q_m k_{33}^2 \frac{1}{\pi \gamma_o \bar{\kappa}_o}$ | $\sqrt{\pi^2 - 8k_{33}^2}$ |
| Thickness Shear (side) | $\frac{A}{l^2}$ | $\varepsilon_{11}^S \frac{\kappa_o v_a}{4\pi}$ | $\frac{\gamma_o}{2Q_m k_{15}^2 \varepsilon_{11}^S v_a}$ | $4Q_m k_{15}^2 \frac{1}{\pi \gamma_o \bar{\kappa}_o}$ | $\sqrt{\pi^2 - 8k_{15}^2}$ |
| Thickness Shear (end) | $\frac{4b}{l}$ | $\varepsilon_{11}^S \frac{\kappa_o v_a}{4\pi}$ | $\frac{\pi}{2Q_m k_{15}^2 \varepsilon_{11}^T v_a}$ | $4Q_m \frac{k_{15}^2}{1-k_{15}^2}\frac{1}{\pi^2 \bar{\kappa}_o}$ | $\sqrt{\pi^2 + 8\frac{k_{15}^2}{1-k_{15}^2}}$ |
| Thickness Extensional | $\frac{A}{l^2}$ | $\varepsilon_{11}^S \frac{\kappa_o v_a}{4\pi}$ | $\frac{\gamma_o}{2Q_m k_t^2 \varepsilon_{33}^S v_a}$ | $4Q_m k_t^2 \frac{1}{\pi \gamma_o \bar{\kappa}_o}$ | $\sqrt{\pi^2 - 8k_t^2}$ |
| Contour Extensional | $\frac{4a}{l}$ | $\varepsilon_{33}^T(1-k_p^2)\frac{\kappa_o v_a}{4\pi}$ | $\frac{\pi}{2Q_m k_p^2 \varepsilon_{33}^T v_a}$ | $4Q_m \frac{k_p^2}{1-k_p^2}\frac{1}{\pi^2 \bar{\kappa}_o}$ | $\sqrt{\pi^2 + 8\frac{k_p^2}{1-k_p^2}}$ |
| Radial | $\frac{\pi a}{l}$ | $\varepsilon_{33}^T(1-k_p^2)\frac{\kappa_o v_a}{4\pi}$ | $\frac{\kappa_{o,r}^2 - (1-\sigma^2)}{Q_m \kappa_{o,r}(1+\sigma)k_p^2 \varepsilon_{33}^T v_a}$ | $Q_m \frac{k_p^2}{1-k_p^2}\frac{2}{\pi \bar{\kappa}_o}\frac{\kappa_{o,r}(1+\sigma)}{\kappa_{o,r}^2 - (1-\sigma^2)}$ | Appendix 10(c) |

Referring to Table 5, from (21), $$\bar{\kappa}_o = \frac{\pi \gamma_o}{\pi + \gamma_o}$$

(see Appendix 10(c) for radial mode).

From here, it can be assumed that the designer has the flexibility to choose the PR's geometric dimensions.

Figure 6B:
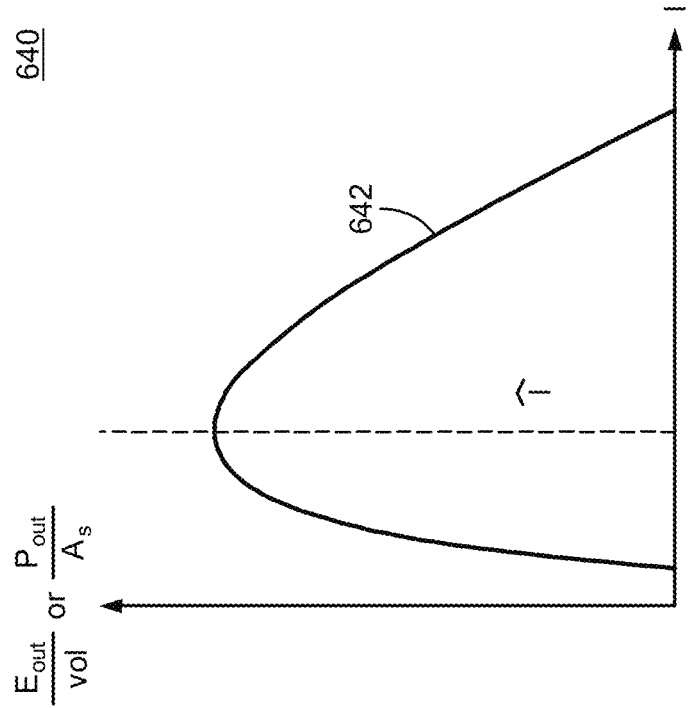
FIG. 6B is a plot showing PR volumetric energy handling density (or areal power handling density) maximum.
Figure 6A:
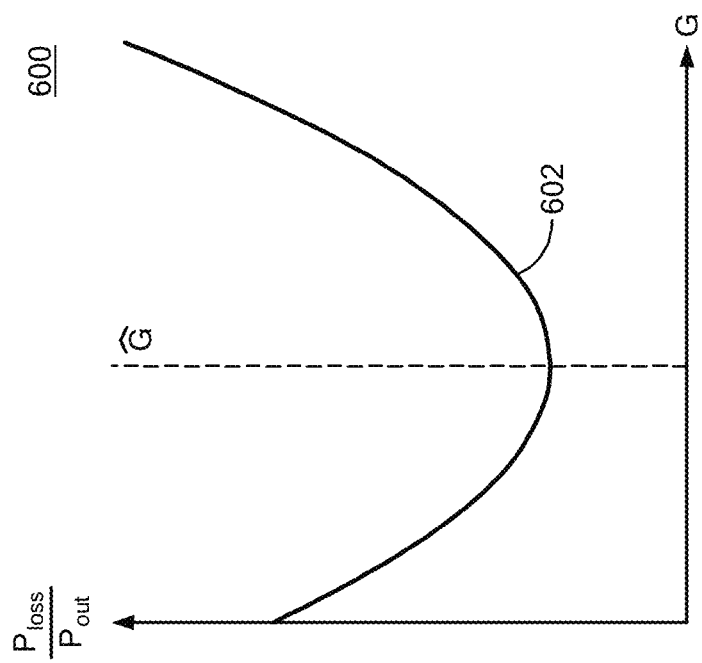
FIG. 6A is a plot showing PR loss ratio minimum.

FIG. 6A is a plot 600 showing PR loss ratio minimum 602 and FIG. 6B is another plot 640 showing PR volumetric energy handling density 642 (or areal power handling density) maximum. Both plots 600, 640 are shown with logarithmic axes. The loss ratio equation reached in equation (15) is a second-order equation with respect to G as illustrated in FIG. 6A. Minimizing equation (15) with respect to G reveals the following G condition (denoted by $\hat{G}$) and corresponding minimum mechanical loss ratio:

$$\hat{G} = \frac{P_{out}}{V_{in}^2 B_o} \quad (17)$$

$$\Rightarrow \left(\frac{P_{loss}}{P_{out}}\right)_{min} = 2\pi^2 B_o R_o \quad (18)$$

The condition in equation (17) cancels the operating point and PR geometry parameters in the loss ratio equation, so the minimum achievable mechanical loss ratio for a PR depends on only its material properties (i.e., quantities assumed in Table 2). Taking the inverse of equation (18), the following unitless factor can therefore be considered a mechanical efficiency FOM ($FOM_M$) for PR materials and vibration modes:

$$FOM_M = \frac{1}{2\pi^2 B_o R_o} \quad (19)$$

$FOM_M$ is desired to be as large as possible, and it is summarized in Table 5 for the considered vibration modes.

B. Geometry Condition

A PR can be designed to achieve its material's minimum mechanical loss ratio at a nominal operating point by satisfying $G=\hat{G}$ with its geometric dimensions. The order of magnitude of $B_o$ ranges from $10^{-8}$ to $10^{-6}$ for most piezoelectric materials, which requires $\hat{G} \gg 1$ in (17) for most power conversion applications. Thus, $\hat{G}$ often dictates l to be the shortest geometric dimension, resulting in primarily planar PR designs. Parallel vibration modes can be particularly advantageous for satisfying large $\hat{G}$ values in that both the numerator (A) and denominator ($l^2$) have squared length dimensions. Mode configurations for which l is not the shortest dimension (length extensional and thickness shear, each with end electrodes) have limited practicality; their relative dimension assumptions can only be maintained for very high $$\frac{V_{in}^2}{P_{out}}.$$

C. Operating Frequency

Though $B_o$ and $R_o$ have no geometry dependence in the derivation of Section 4(a), $B_o$ depends on $\kappa_o$, which spans the ranges of equations (4) and (5) for the inductive region 306 shown in FIG. 3. Although the assumed switching sequence described in Section 3(a) naturally spans this inductive region, frequency is not an independent control variable. To maintain the high-efficiency behaviors described in Section 3, the exact operating frequency (and therefore the exact $\kappa_o$) is dictated by the operating point.

Thus, frequency and $\kappa_o$ that correspond to the minimum loss ratio in equations (17)-(18) are determined for use in the FOMs of Sections 4 and 5 (though this is also useful for broader converter design). Inserting $\hat{G}$ into the amplitude of resonance model of equation (6) reveals both addends to be equal for this condition. Based on the amplitude of resonance model's origin, this implies that the PR's charge transfer is split evenly between connected/zero stages (resonating at $f_r$) and open stages (resonating at $f_{ar}$). Thus, one can approximate the highest-efficiency operating frequency to be the harmonic mean of $f_r$ and $f_{ar}$ (i.e., the reciprocal of the average of $$\frac{1}{f_r}$$

and $$\frac{1}{f_{ar}}$$

$$\bar{f} = \frac{2 f_r f_{ar}}{f_r + f_{ar}} \quad (20)$$

which has the following geometry-normalized wave number (also derived for radial mode in Appendix A(c)):

$$\bar{\kappa}_o = \frac{\pi \gamma_o}{\pi + \gamma_o} \quad (21)$$

Thus, assuming the switching sequence constraints listed in Section 3 are met, this is the operating frequency for which equation (17) is satisfied and the minimum loss ratio occurs. This is the operating frequency assumed for the remainder of this disclosure.

5. Power Density Figures of Merit

A second point of comparison for piezoelectric materials and vibration modes is achievable power handling density, which poses a boundary for converter miniaturization. Useful power density metrics must consider how the PR is to be utilized in a converter (i.e., not just energy storage capability), so the amplitude of resonance model in Section 3 can again be assumed. To model the PR's power handling capability as a function of operating constraints, equation (6) can be rearranged such that power delivered is the following function of $I_L$:

$$P_{out} = \frac{1}{\pi} V_{in} I_L - C_p f V_{in}^2 = \frac{1}{\pi} V_{in} I_L - B V_{in}^2 \quad (22)$$

With equation (22), the maximum energy and power handling densities can be derived considering the physical and loss-density limits for $I_L$ presented in Sections 3(b) and 3(c), respectively.

A. Volumetric Energy Handling Density

Volumetric power density is a common metric for converter power handling capability with respect to size. The PR's volumetric power density can be derived by first dividing (22) by volume, where vol=2Al:

$$\frac{P_{out}}{vol} = \frac{P_{out}}{2Al} = G_f \left( \frac{1}{2\pi l} V_{in} I_{Lmaxo} - \frac{1}{2l^2} B_o V_{in}^2 \right) \quad (23)$$

in which $I_L$ has been set equal to $I_{Lmax}$ and geometry terms have been separated from material properties. It is evident that a PR's volumetric power density is directly proportional to $G_f$, and therefore $f$. The operating frequency of a converter determines its driving and control requirements, so it is elected to normalize equation (23) to $f$ for even comparison between PR vibration modes with respect to converter capability. Such normalization results in the following expression for volumetric energy handling density (i.e., the quantity of energy the PR can deliver to the load in one resonant cycle, divided by volume):

$$\frac{E_{out}}{vol} = \frac{P_{out}}{vol \cdot f} = \frac{1}{\kappa_o v_a} \left( \frac{1}{l} V_{in} I_{Lmaxo} - \frac{\pi}{l^2} B_o V_{in}^2 \right) \quad (24)$$

Of note, energy handling density should not be confused with energy storage capability; not all of the PR's stored energy can be delivered to the load in one resonant cycle since the energy is stored mechanically.

This expression can be maximized by assuming the designer has the flexibility to choose l. Maximizing equation (24) with respect to l as illustrated in FIG. 6B results in the following l condition (denoted $\hat{l}$) and maximum volumetric energy handling density:

$$\hat{l} = 2\pi \frac{B_o V_{in}}{I_{Lmaxo}} \quad (25)$$

$$\Rightarrow \left( \frac{E_{out}}{vol} \right)_{max} = \frac{I_{Lmaxo}^2 \varepsilon}{16\pi^2 B_o^2} \quad (26)$$

Thus, all operating point and geometry terms cancel in equation (26), and the maximum volumetric energy handling density of a PR depends on only its material properties (defined in Table 2). The following can therefore be considered a volumetric energy handling density FOM for direct comparison between PR materials and vibration modes:

$$FOM_{VED} = \frac{I_{Lmaxo}^2 \varepsilon}{16\pi^2 B_o^2} \quad (27)$$

which has units J/m$^3$. FOM$_{VED}$ is summarized for various PR vibration modes in Table 6; the minimum-loss wave number $\overline{\kappa}_o$ as detailed in Section 4(c) may be used. The corresponding volumetric power density can be calculated by multiplying FOM$_{VED}$ by the operating frequency, though frequency depends on l for parallel modes.

TABLE 6

| Power Density Figures of Merit | | | |
|---|---|---|---|
| Vibration Mode | FOM$_{VED}$ | FOM$_{APD}$ | A$_s$ |
| Length Extensional (s) | $\dfrac{I_{Lmaxo}^2}{\overline{\kappa}_o^2 v_a^2 \varepsilon_{33}^T (1-k_{31}^2)}$ | $\dfrac{I_{Lmaxo}^2}{\pi \overline{\kappa}_o \varepsilon_{33}^T (1-k_{31}^2) v_a}$ | 4bl |
| Length Extensional (e) | $\dfrac{I_{Lmaxo}^2}{\overline{\kappa}_o^2 v_a^2 \varepsilon_{33}^T (1-k_{33}^2)}$ | $\dfrac{I_{Lmaxo}^2}{\pi \overline{\kappa}_o \varepsilon_{33}^T (1-k_{33}^2) v_a}$ | A |
| Thickness Shear (side) | $\dfrac{I_{Lmaxo}^2}{\overline{\kappa}_o^2 v_a^2 \varepsilon_{11}^S}$ | $\dfrac{I_{Lmaxo}^2}{\pi \overline{\kappa}_o \varepsilon_{11}^S v_a}$ | A |
| Thickness Shear (end) | $\dfrac{I_{Lmaxo}^2}{\overline{\kappa}_o^2 v_a^2 \varepsilon_{11}^S}$ | $\dfrac{I_{Lmaxo}^2}{\pi \overline{\kappa}_o \varepsilon_{11}^S v_a}$ | 4bl |
| Thickness Extensional | $\dfrac{I_{Lmaxo}^2}{\overline{\kappa}_o^2 v_a^2 \varepsilon_{33}^S}$ | $\dfrac{I_{Lmaxo}^2}{\pi \overline{\kappa}_o \varepsilon_{33}^S v_a}$ | A |
| Contour Extensional | $\dfrac{I_{Lmaxo}^2}{\overline{\kappa}_o^2 v_a^2 \varepsilon_{33}^T (1-k_p^2)}$ | $\dfrac{I_{Lmaxo}^2}{\pi \overline{\kappa}_o \varepsilon_{33}^T (1-k_p^2) v_a}$ | 4al |
| Radial | $\dfrac{I_{Lmaxo}^2}{\overline{\kappa}_o^2 v_a^2 \varepsilon_{33}^T (1-k_p^2)}$ | $\dfrac{I_{Lmaxo}^2}{\pi \overline{\kappa}_o \varepsilon_{33}^T (1-k_p^2) v_a}$ | πal |

Referring to Table 6, from equation (21), $$\overline{\kappa}_o = \frac{\pi \gamma_o}{\pi + \gamma_o}$$

(see Appendix 10(c) for radial mode).

For parallel modes, maximum volumetric power density occurs for $$l = \frac{3}{4} \hat{l},$$

though with diminishing returns with respect to frequency for l<$\hat{l}$. The volumetric power density at $$l = \frac{3}{4} \hat{l}$$

is approximately 18.5% greater than that at l=$\hat{l}$. For perpendicular modes, frequency depends on a non-l dimension and can therefore be manipulated independently.

B. Areal Power Handling Density

In some applications, power handling capability per footprint area may be more useful to the designer than volumetric energy handling density. Areal power density also becomes more relevant for highly-planar PR designs, as often dictated by $\hat{G}$ in (17) for maximum efficiency. Like Section 3(c), it is assumed that the area of interest A$_s$=A for parallel modes and A$_s$=G$_f$Al for perpendicular modes as displayed in Table 6. Similar to equation (23), the areal power density can be written as follows with I$_L$=I$_{Lmax}$ and geometry terms extracted:

$$\frac{P_{out}}{A_s} = \frac{1}{\pi l} V_{in} I_{Lmaxo} - \frac{1}{l^2} B_o V_{in}^2 \quad (28)$$

This expression can be likewise maximized with respect to l, resulting in the same $\hat{l}$ condition and the following maximum areal power density:

$$\hat{l} = \frac{2\pi B_o V_{in}}{I_{Lmaxo}} \quad (29)$$

$$\Rightarrow \left( \frac{P_{out}}{A_s} \right)_{max} = \frac{I_{Lmaxo}^2}{4\pi^2 B_o} \quad (30)$$

Like the maximum volumetric energy handling density in equation (26), the maximum areal power density for a PR depends on only its material properties. Thus, equation (30)

serves as an areal power handling density FOM for PR material and vibration modes:

$$FOM_{APD\parallel} = \frac{I_{Lmaxo}^2}{4\pi^2 B_o} \quad (31)$$

with units W/m². $FOM_{APD}$ is likewise summarized Table 6 for each considered vibration mode. It should be noted that this $FOM_{APD}$ derivation assumes the area $A_s$ corresponds to the PR's relevant footprint, though the validity of this assumption depends on the PR's shape, vibration mode, and mounting structure. For contour and radial modes (i.e., modes for which both non-i dimensions are equal), $FOM_{APD}$ may be scaled by $$\frac{4}{\hat{G}}$$

for a representative areal power density based on A (assuming a PR design will adhere to the $\hat{G}$ condition for maximum efficiency). Since $\hat{G}$ varies by operating point, this scaled $FOM_{APD}$ for such configurations also depends on operating point information unless $FOM_{APD}$ is limited by loss density (which cancels the $\hat{G}$ dependence).

6. Material and Vibration Mode Comparison

Equipped with FOMs for mechanical efficiency and power density, it is now demonstrated how to use these FOMs to evaluate piezoelectric materials and vibration modes for power conversion. First relative capabilities of commercially-available variants of hard PZT are compared. PZT is the most widely-utilized piezoelectric material for sensing, actuation, transduction, and energy harvesting applications. This is followed by a comparison of the seven vibration modes discussed herein for PZT and lithium niobate ($LiNbO_3$), a second piezoelectric material of emerging interest for power conversion. It should be noted that the results of these studies are meant to be more demonstrative of the FOMs than prescriptive of the materials; their results are sensitive to variation between manufacturers in terms of measurement procedure and/or reporting of material properties (particularly for $E_{max}$ and $Q_m$).

A. Comparing Materials

Commercial PZT materials can be compared based on efficiency and power density for the thickness extensional and thickness shear vibration modes (with side electrodes). The following properties for 30 hard PZT materials from eight different manufacturers can be collected and/or calculated: $Q_m$, $\varepsilon_{33}^S$, $\varepsilon_{11}^S$, $k_t$, $k_{15}$, and $v_a$ for each mode ( $$v_a = \frac{\pi N}{\kappa_{o,r}},$$

where N is the manufacturer-provided frequency constant). Sinusoidal amplitude $E_{max}$ can be conservatively estimated to be 500 V/mm for all materials, and power density capability is assumed to be limited by this $E_{max}$. These properties can be used to calculate $FOM_M$ and $FOM_{APD}$ for both modes with each material.

Figure 7:
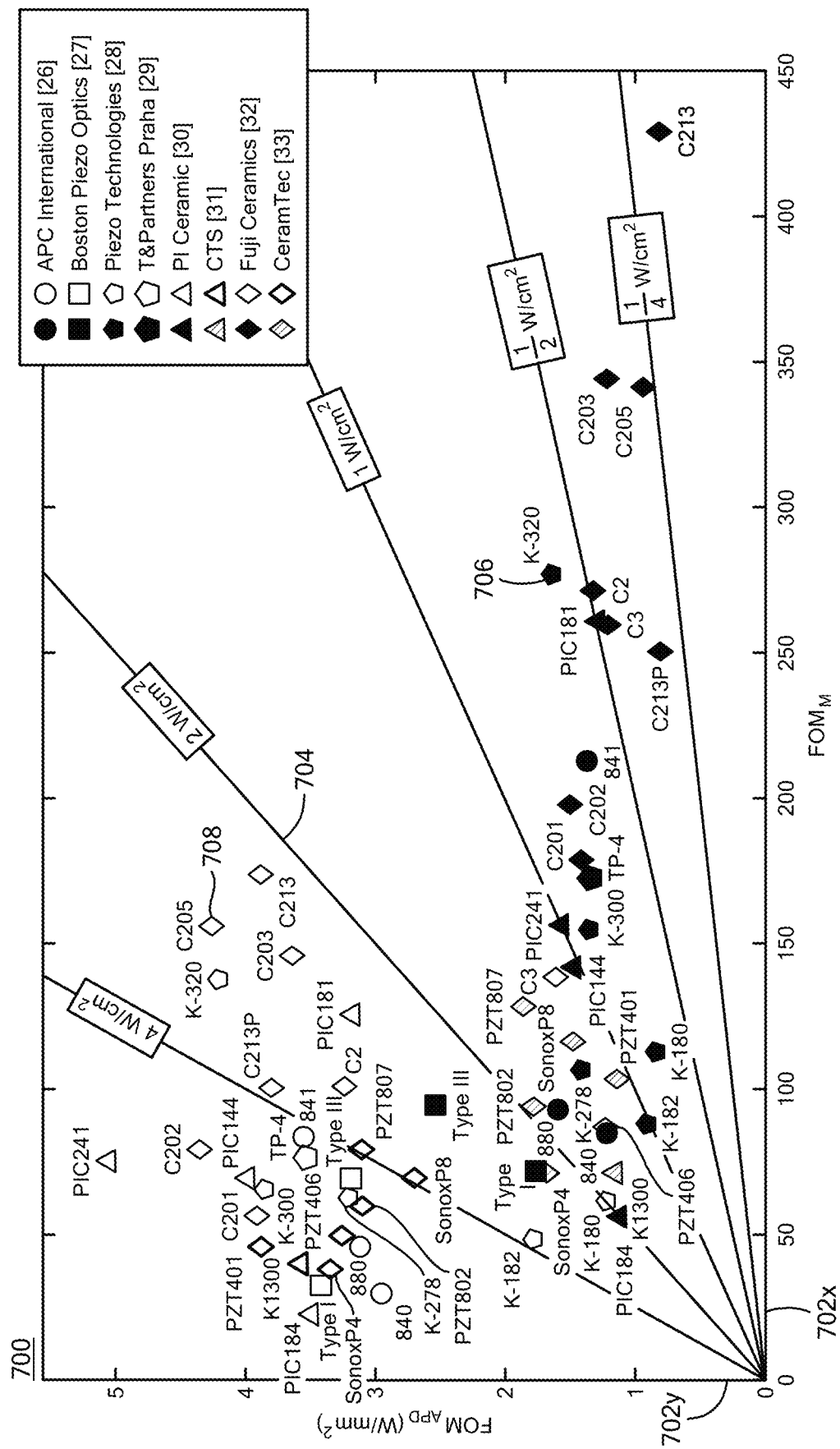
FIG. 7 is a plot showing a comparison of hard lead zirconate titanate (PZT) materials for power conversion.

FIG. 7 is a plot 700 displaying these results with one FOM on each axis, and the considered materials exhibit wide variation in terms of capability. In particular, $FOM_M$ is represented by horizontal axis 702x and $FOM_{APD}$ is represented by vertical axis 702y. FIG. 7 shows a comparison of hard PZT materials for power conversion based on $FOM_M$ and $FOM_{APD}$, overlaid with areal-loss-density contour lines (e.g., contour line 704). Filled and unfilled markers (e.g., filled marker 706 and unfilled marker 708) indicate the thickness shear with side electrodes (e.g., mode 206 of FIG. 2C) and thickness extensional vibration modes (e.g., mode 210 of FIG. 2E), respectively. The two considered operating modes are generally clustered, with thickness extensional mode (denoted by unfilled markers) demonstrating higher power density capability given the same $E_{max}$ and thickness shear mode (denoted by filled markers) showing higher efficiency capability.

FIG. 7 is further overlaid with loss-density contour lines (e.g., contour line 704) to help identify thermal management limits, which vary based on design and application constraints. For a given areal loss density limit, all points above the corresponding contour line can be projected downward (in the −y direction, keeping constant $FOM_M$) onto the allowable heat transfer line itself; this new point conveys their maximum power densities given the assumed limit. It can be inferred that many materials would in fact never reach the assumed $E_{max}$ limit without aggressive thermal management; for a given thermal capability, higher power density is instead enabled by a higher $FOM_M$. In the context of this disclosure, this implies that the thickness shear mode can enable higher power densities than the thickness extensional mode under practical loss density constraints (≤1 W/cm²).

B. Comparing Vibration Modes

Next, the seven vibration modes analyzed herein for hard PZT and lithium niobate are compared. Using material properties respectively from "Material coefficients PIC181," PI Ceramic and "Lithium niobate," Boston Piezo Optics Inc. (available online), $FOM_M$, $FOM_{VED}$, and $FOM_{APD}$ are calculated each vibration mode and display in Table 7. For lithium niobate, material properties stated in the later reference are assumed as-is, though different cuts can be similarly compared.

TABLE 7

Vibration Mode Comparison for Hard PZT and $LiNbO_3$

| | Hard PZT (PIC181) | | | | | $LiNbO_3$ | | | | |
|---|---|---|---|---|---|---|---|---|---|---|
| Mode | $FOM_M$ | $FOM_{VED}$ (J/m³) | $FOM_{APD}$ (W/cm²) | $\hat{G}*$ | Theoretical Design* | $FOM_M$ | $FOM_{VED}$ (J/m³) | $FOM_{APD}$ (W/cm²) | $\hat{G}*$ | Theoretical Design* |
| Length Ext. (s) | 63.4 | 15100 | 63.4 | 264 | l = 240 μm, b = 16 mm | 1.26 | 4.14 | 1.26 | 5190 | l = 390 μm, b = 510 mm |
| Length Ext. (e) | 345 | 1930 | 345 | 395 | N/A | 74.0 | 224 | 74.0 | 4910 | N/A |

TABLE 7-continued

Vibration Mode Comparison for Hard PZT and LiNbO₃

| | Hard PZT (PIC181) | | | | | LiNbO₃ | | | | |
|---|---|---|---|---|---|---|---|---|---|---|
| Mode | $FOM_M$ | $FOM_{VED}$ (J/m³) | $FOM_{APD}$ (W/cm²) | $\hat{G}*$ | Theoretical Design* | $FOM_M$ | $FOM_{VED}$ (J/m³) | $FOM_{APD}$ (W/cm²) | $\hat{G}*$ | Theoretical Design* |
| Thickness Shear (side) | 303 | 2740 | 302 | 553 | $l = 77$ μm, $\sqrt{\frac{A}{4}} = 910\,\mu m$ | 1260 | 7490 | 1520 | 5020 | $l = 11$ μm, $\sqrt{\frac{A}{4}} = 410\,\mu m$ |
| Thickness Shear (end) | 338 | 3210 | 337 | 581 | $l = 71$ μm, $b = 10$ mm | 1388 | 8630 | 1680 | 5240 | $l = 11$ μm, $b = 14$ mm |
| Thickness Extensional | 138 | 631 | 138 | 330 | $l = 150$ μm, $\sqrt{\frac{A}{4}} = 1.3$ mm | 72.0 | 198 | 72.0 | 4450 | $l = 56$ μm, $\sqrt{\frac{A}{4}} = 1.9$ mm |
| Contour Extensional | 302 | 13200 | 33.0* | 302 | $l = 36$ μm, $a = 2.8$ mm | 3.14 | 12900* | 3.14 | 5090 | $l = 7$ μm, $a = 8.9$ mm |
| Radial | 230 | 15600 | 67.3* | 230 | $l = 34$ μm, $a = 2.5$ mm | 2.71 | 8040* | 3.12 | 4030 | $l = 9$ μm, $a = 11$ mm |

(*) Assuming an example operating point of $V_{in}=100V$ and $P_{out}=10$ W. PZT power density is E-field-limited for contour extensional and radial modes at this assumed operating point. All other modes (including for LiNbO₃) are loss-limited.

In Table 7, the same $Q_m$ and $E_{max}$ are assumed for all modes of each material; $Q_m$ is assumed to be 2,200 for PIC181 and 10,000 for LiNbO₃ (as reported in the datasheets), and $E_{max}$ is assumed to be 633 V/mm for PIC181 and 7000 V/mm for LiNbO₃ (these values are ⅓ the coercive field of each material). A loss density limit of 1 W/cm² is also assumed, so the displayed FOMs are based on the lower of these two limits as described in Section 3(b). Contour and radial mode FOMs that have been scaled by $\hat{G}$ are marked with asterisks in Table 7; these FOMs assume $V_{in}=100V$ and $P_{out}=10$ W. For this operating point, $\hat{G}$ and a corresponding theoretical design for both maximum efficiency and maximum power density (based on $\hat{G}$ and $\hat{l}$) are displayed for each mode. Modes for which this theoretical design violates the relative dimension assumptions in FIGS. 2A-2G are marked with "N/A".

Table 7 shows the modes of each material to have significantly varying capabilities with respect to mechanical efficiency, volumetric energy handling density, and areal power density. Higher $FOM_M$ is associated with higher $k^2$ (since the same $Q_m$ is assumed for all modes of the same material), and particularly high $FOM_M$s are shown for LiNbO₃ shear modes. Perpendicular vibration modes tend to have higher $FOM_{VED}$ and lower $FOM_{APD}$ compared to parallel modes, which implies that perpendicular modes are capable of higher volumetric power densities for a given frequency but tend to be more planar in nature, requiring more footprint area. It is also noted that some modes would have to operate at more than an order of magnitude higher frequency than other modes to achieve the same volumetric power density.

Differences in geometry requirements are further highlighted by $\hat{G}$ and the displayed theoretical designs. LiNbO₃ generally requires an order of magnitude higher $\hat{G}$ than PZT, resulting in more planar-shaped geometries that often require more footprint area or higher operating frequencies for similar density. Perpendicular modes likewise require more extreme planar shapes for the same $\hat{G}$ compared to parallel modes (as described in Section 4(b), parallel modes have the advantage that the length dimensions comprising $\hat{G}$ are squared). This is less pronounced at lower G values but more exaggerated for higher $\hat{G}$, making parallel modes more advantageous for high power applications. As $\hat{G}$ approaches infinite, all modes besides length extensional (end electrodes) are capable of designs that meet the relative dimension assumptions in FIGS. 2A-2G. As $\hat{G}$ approaches zero, the set of compatible modes reduces to just the two length extensional modes and thickness shear (end electrodes) mode (out of the modes considered).

Of note, length extensional with side electrodes mode and thickness shear with end electrode modes are theoretically capable of meeting the relative dimension assumptions for any $\hat{G}$ since $\alpha$ is unconstrained, though the resulting shape may be heavily distorted.

Thus, the most appropriate piezoelectric materials and vibration modes depend heavily on the target application space. In addition to PZT and LiNbO₃, there are numerous other piezoelectric materials that may be similarly evaluated for power conversion using these FOMs.

7. Figure of Merit Validation

To evaluate their utility, the FOMs derived herein are now validated with a numerically-obtained periodic steady state solution (PSSS) of converter behavior and experimental results.

A. Periodic Steady State Solution

As is known, a PSSS details the PR's state trajectories throughout a converter switching sequence based on its circuit model parameters and the desired operating point ($V_{in}$, $V_{out}$, and $P_{out}$); it has no dependence on the amplitude of resonance model or other derivations herein. With an "exact" PSSS (i.e., considering resistor 408 (R) in the circuit model FIG. 4, which requires a numerical solution), useful information can be extracted from the PR's state trajectories like loss and output power for validating the derived FOMs.

First, validation is done of the minimum loss ratio and maximum power densities with geometry and material data for 572 APC International discrete PR parts listed on "Ready to deliver piezoelectric ceramics," APC International (available online); these parts consist of round and rectangular PRs of varying dimensions, spanning nine total materials. For each part, the following can be performed:

1. Calculate its circuit model parameters (as shown in Table 3) for a given vibration mode.
2. Based on its dimensions, determine $V_{in}$ and $P_{out}$ corresponding to its minimum loss ratio and maximum energy handling density using equations (17) and (25), assuming $I_{Lmax}$ to be limited by a loss density of 1 W/cm$^2$.
3. For this operating point, solve for the exact PSSS of the PR's states as detailed in Boles et al., assuming the converter switching sequence and high-efficiency behaviors corresponding to equation (6) and $V_{out}=0.55V_{in}$ ($I_L$ is predicted to be constant with respect to $V_{out}$ for $$V_{in} > V_{out} > \frac{1}{2}V_{in}$$

4. Extract output power and loss information from the PR's PSSS state trajectories.

Ultimately, all discrete parts of the same material yield the same minimum loss ratio, maximum energy handling density, and maximum areal power density for a given vibration mode. In Table 8, these PSSS-calculated results for the $k_{33}$ mode are compared with their derived estimates and demonstrate very small error for all low-loss-ratio materials (though the error is higher for lossier materials since equation (6) models an ideal PR).

TABLE 8

PSSS Figure of Merit Validation

| Material | $Q_m$ | $k_{33}$ | $\frac{P_{loss}}{P_{out}}$ vs. (18) | $\kappa_o$ vs. (21) (radians) | $\frac{E_{out}}{vol}$ vs. (26) (J/m$^3$) | $\frac{P_{out}}{A}$ vs. (30) (W/cm$^2$) | $\frac{P_{loss}}{A}$ vs. 1.00 (W/cm$^2$) |
|---|---|---|---|---|---|---|---|
| 840 | 500 | 0.72 | .0102 \| .0102 | 1.371 \| 1.364 | 429.6 \| 432.3 | 97.97 \| 98.07 | 1.002 |
| 841 | 1400 | 0.68 | .0041 \| .0041 | 1.389 \| 1.385 | 1073 \| 1079 | 241.0 \| 241.9 | 0.9912 |
| 842 | 600 | 0.71* | .0086 \| .0086 | 1.373 \| 1.366 | 499.3 \| 502.0 | 116.3 \| 116.3 | 1.001 |
| 844 | 1500 | 0.65* | .0043 \| .0044 | 1.404 \| 1.405 | 1009 \| 1009 | 228.6 \| 228.6 | .9940 |
| 840-844 Average Error: | | | 0.37% | 0.31% | 0.45% | 0.13% | 0.43% |
| 880 | 1000 | 0.62 | .0083 \| .0083 | 1.433 \| 1.436 | 523.2 \| 523.7 | 119.5 \| 120.0 | .9939 |
| 881 | 1000 | 0.73* | .0047 \| .0047 | 1.360 \| 1.350 | 906.4 \| 910.4 | 213.6 \| 212.9 | 1.002 |
| 880-881 Average Error: | | | 0.20% | 0.50% | 0.26% | 0.33% | 0.39% |

(*) Calculated using $k_{33}^2 = Y_{33}^E d_{33}^2 / \varepsilon_{33}^T$. Not shown in Table 8: Soft PZT materials 850, 851, and 855 have loss ratios up to 0.069, with an average error (compared to (18)) of up to 6%. These materials have significantly more loss than hard PZT and are therefore less conducive to power conversion.

Thus, the PSSS validates the following:

The independence of $$\bar{\kappa}_o, \left(\frac{P_{loss}}{P_{out}}\right)_{min}, \left(\frac{E_{out}}{vol}\right)_{max}, \left(\frac{P_{out}}{A_s}\right)_{max}, \text{ and } \frac{P_{loss}}{A_s}$$

from PR geometry and operating point information; these quantities depend on only material properties.

The minimum loss ratio value of equation (18), geometry condition of equation (17), and operating point of equation (21).

The maximum energy density and power density values of equations (26) and (30), respectively, and geometry condition of equation (25).

The dependence of energy, power, and loss densities of equations (26), (30), and (10), respectively, on normalized amplitude of resonance $I_{Lo}$.

B. Experimental Results

Figure 8:
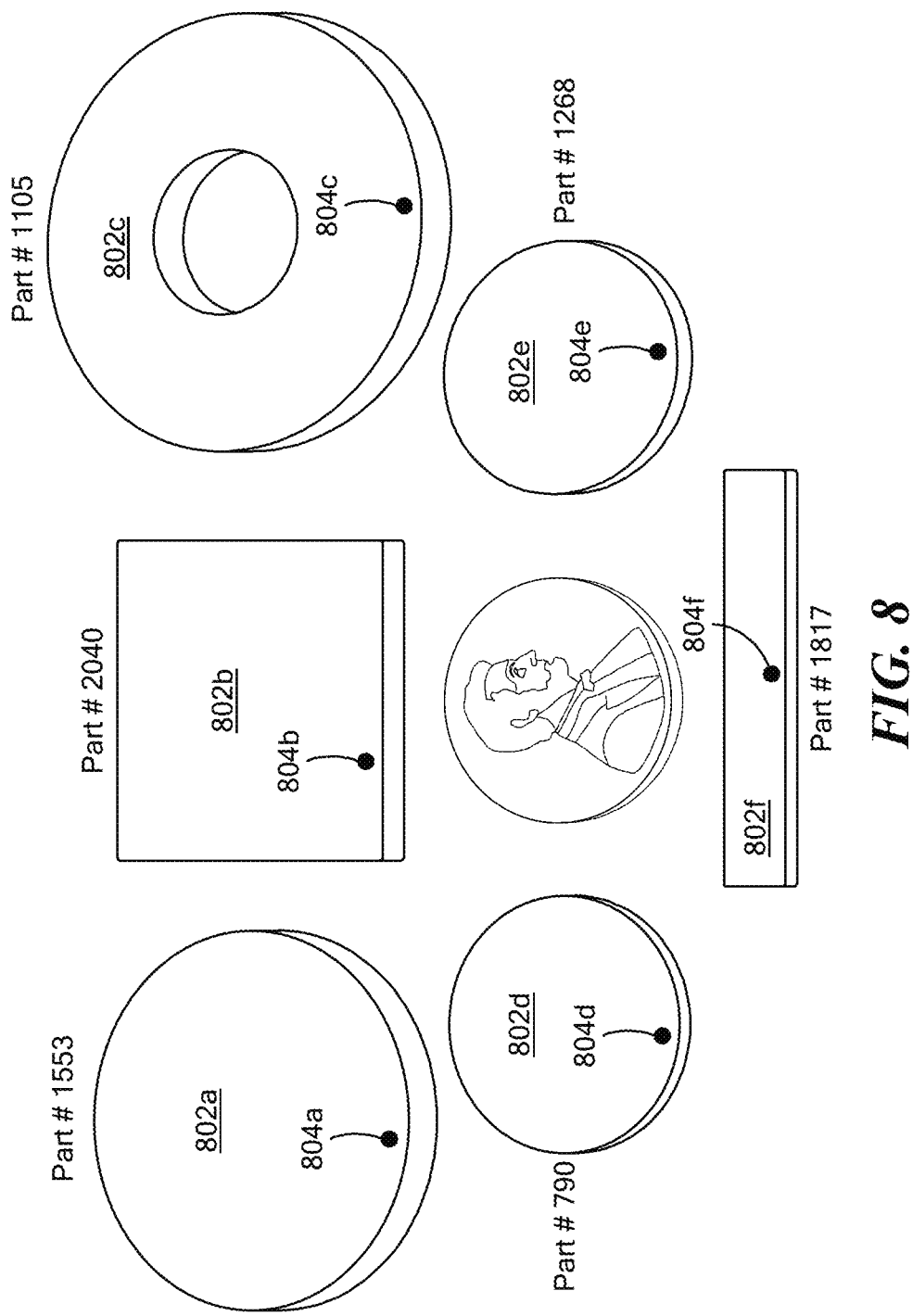
FIG. 8 is a photograph of various PRs tested for experimental FOM validation, according to the present disclosure.

FIG. 8 illustrative various PRs 802a-802f tested for experimental FOM validation. The illustrated PRs 802a-802f may be identified by part #'s 1553, 2040, 1105, 790, 1268, and 1817, respectively. The wire attachment locations for the various PRs 802a-802f are marked with respective dots 804a-804f.

Figure 9:
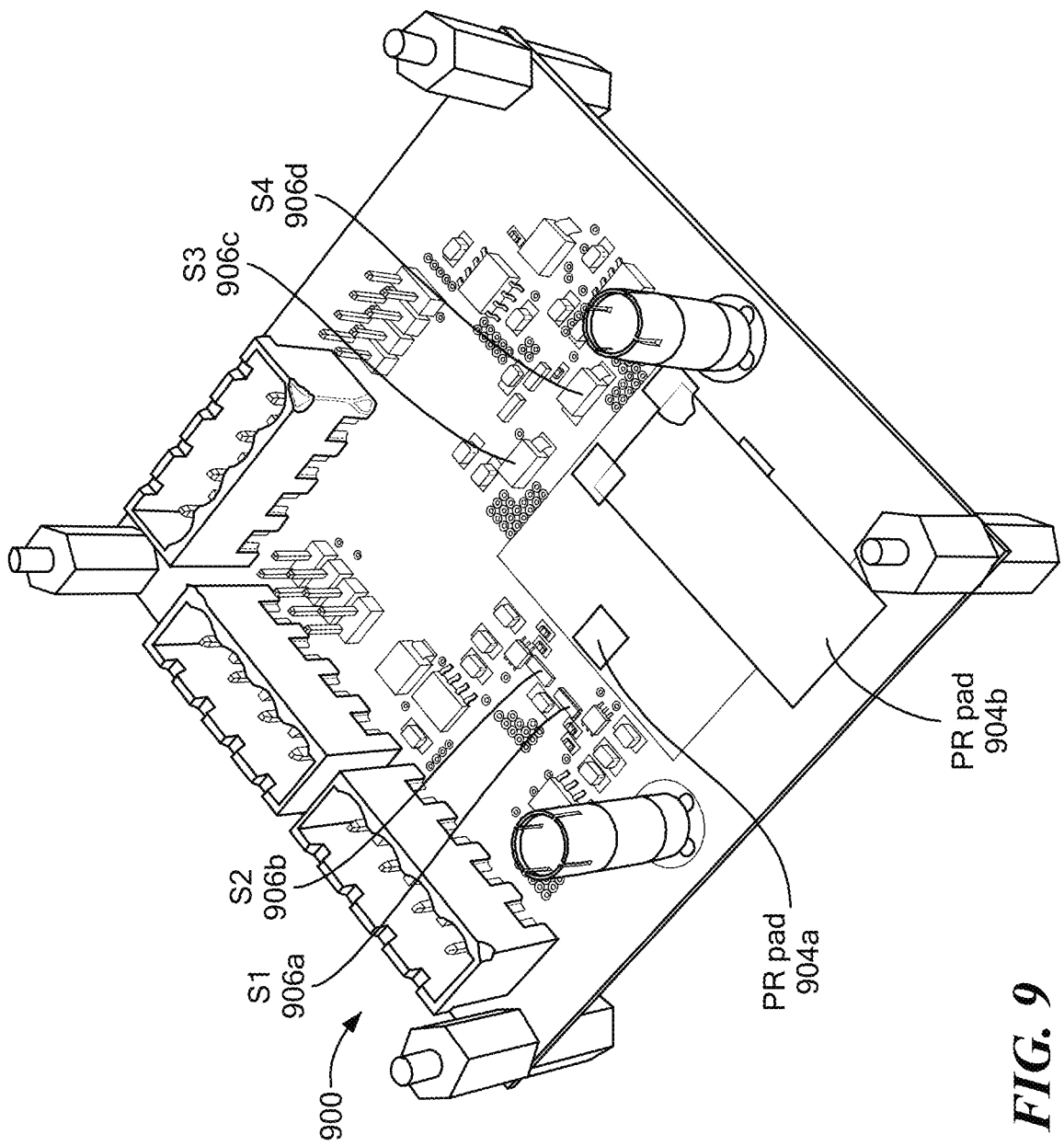
FIG. 9 is a photograph of an illustrative circuit board for PR-based power conversion, according to the present disclosure.

FIG. 9 shows an experimental prototype board 900 that can be used for testing the PRs 802a-802f of FIG. 8. The various PRs can be mounted proximate to PR pads 904a, 904b. In more detail, part #790 (e.g., PR 802d in FIG. 8) and part #1817 (e.g., PR 802f in FIG. 8) can be mounted in an upright position on the board, with two wires mechanically supporting the PR. All other PRs can be positioned horizontally with the bottom electrode making contact with the copper ribbon and the other attached with a non-rigid wire. The board 900 of FIG. 9 also includes switches 906a-906d (S1-S4). One or more of the switches 906a-906d may be provided as field-effect transistors (FETs), such as EPC 2019 GaN FETs. In some embodiments, third switch 906c (S3) and fourth switch 906d (S4) may be provided as diodes, such as ON Semiconductor NRVSTA4100 Schottky diodes.

FIG. 10 shows a prototype topology 1000 that may be used within the board of FIG. 9. Like elements of FIG. 9 are show using like reference designators in FIG. 10. In addition to switches 906a-906d, the topology 1000 includes a PR model 1002, an input voltage 1004, a resistive load 1006, and a capacitor 1008, arranged as shown. PR model 1002 may be the same as or similar to circuit model 400 of FIG. 4. As illustrated, switches 906c, 906d (S3, S4) can be implemented as active switches 908c, 908d or diodes 910c, 910d (i.e., topology 1000 may include either the active switches 908c, 908d shown or the diodes 910c, 910d shown).

The mechanical efficiency FOM is further validated experimentally using six of the PR parts considered in Section 7. These PRs consist of APC International's highest FOM$_M$ materials (841, 844, 880, and 881) in different shapes and sizes as pictured in FIG. 8. These parts are selected to be low in frequency (<600 kHz) to minimize frequency-dependent loss and potential damping effects due to mounting when validating the FOMs. With each PR, the following can be performed:
1. Plot the PR's impedance characteristic (e.g., generate a plot similar to plot 300 of FIG. 3) for a given vibration mode using a network analyzer.

2. Estimate $Q_m$ and k based on the impedance characteristic, as detailed in Appendix D(a).
3. Calculate the minimum loss ratio for the estimated $Q_m$ and k using equation (18), as well as the minimum-loss-ratio $P_{out}$ dictated by equation (17), assuming $V_{in}=100$ V (detailed in Appendix D(b)).

and therefore still provides representative behavior of the assumed operating region as demonstrated in Boles et al.

The results of these experiments, along with material, vibration mode, and frequency information for each PR, are displayed in Table 9.

TABLE 9

Experimental Figure of Merit Validation

| Part No. | Material | Vibration Mode | $Q_m$ | k | $C_p$ (nF) | f vs. (20) (kHz) | $P_{out}$ vs. (17) (W) | $\frac{P_{loss}}{P_{out}}$ vs. (18) (PR only) | Converter Efficiency |
|---|---|---|---|---|---|---|---|---|---|
| 1817 | 841 | Length Ext. (s) | 850 | .32 | .879 | 56.7 \| 56.6 | 0.61 \| 0.78 | .0449 \| .0402 | 95.02% |
| 1105 | 841 | Thickness Ext. | 2500 | .31 | .602 | 601 \| 596 | 6.4 \| 6.6 | .0247 \| .0156 | 96.90% |
| 2040 | 880 | Contour Ext. | 1600 | .52 | 1.64 | 80.6 \| 80.9 | 1.6 \| 1.7 | .0095 \| .0069 | 98.36% |
| 1553 | 841 | Radial | 1700 | .58 | 1.50 | 80.4 \| 80.9 | 1.6 \| 1.6 | .0070 \| .0049 | 98.61% |
| 790 | 844 | Radial | 1400 | .55 | 3.53 | 126 \| 122 | 2.8 \| 4.9 | .0068 \| .0069 | 98.63% |
| 1268 | 881 | Radial | 1600 | .52 | .643 | 128 \| 129 | 1.3 \| 1.5 | .0094 \| .0072 | 98.36% |

4. Test the PR in a prototype converter, such as shown in FIG. 9 (which has the topology in FIG. 10) with the $V_{in}-V_{out}$, Zero, $V_{out}$ switching sequence and high-efficiency behaviors assumed in Section 3. $V_{in}=100$ V and $V_{out}=49$ V. To identify the minimum loss ratio, sweep through multiple power levels surrounding the calculated $P_{out}$. More information about the converter prototype and switching sequence can be found in Boles et al.
5. Reduce whole-converter power measurements to an approximate PR loss ratio by extracting other known loss (i.e., the voltage drop incurred by the Schottky diode rectifier). This is likewise detailed in Appendix D(c).

Of note, the switching sequence assumed in Section 3 has maximum and constant efficiency for the range $$V_{in} > V_{out} > \frac{1}{2}V_{in},$$

which requires an active switch for S3. Efficiency is continuous across the $$V_{out} = \frac{1}{2}V_{in}$$

boundary and then decreases for $$V_{out} < \frac{1}{2}V_{in},$$

though the latter region permits used of two diodes for S3 and S4 as detailed in Boles et al. In the absence of closed-loop control, testing can be done at $V_{out}=0.49V_{in}$ with a diode rectifier; this operating point is very close to the boundary of $V_{out} = \frac{1}{2}V_{in}$ All quantities in Table 9 are either measured values or calculations based on the measured values for $f_r$, $f_{ar}$, $C_p$, $P_{in}$, and $P_{out}$.

Figure 11:
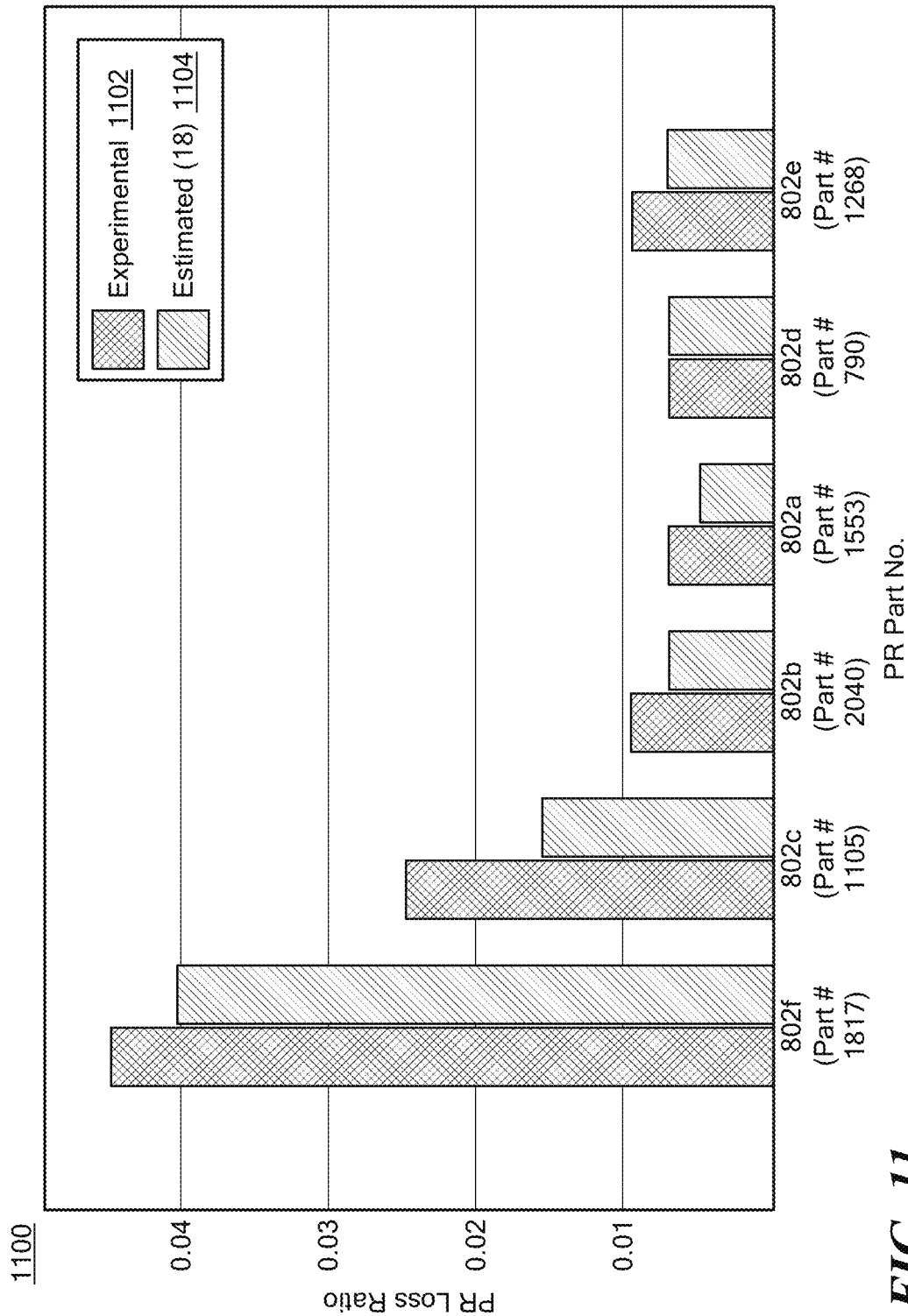
FIG. 11 is a plot showing minimum loss ratio that can be exhibited by disclosed embodiments of PR-based converters.

FIG. 11 is a plot 1100 showing experimental minimum loss ratio 1102 compared to the estimate 1104 in equation (18) for the PRs 802a-802f of FIG. 8 operated in the converter prototype 900 of FIG. 9. The estimated loss ratio tracks the trend of the experimental loss ratio as visualized in plot 1100 of FIG. 11, albeit a slight underestimation for most PRs. Sources for the observed discrepancies may include parasitic capacitances on the board such as switch capacitances (the PRs were characterized alone on the network analyzer, without the board), as well as differences between the PR's small-signal (as characterized) and large-signal (as tested) characteristics. Nevertheless, equation (18) provides a close approximation of the loss ratio to be expected by a given material and vibration mode, validating the utility of $FOM_M$.

8. Fundamental Scaling Properties

PRs have been previously suggested to have advantageous power density and efficiency scaling properties compared to magnetics. Using FOM derivations described herein, it can now be explored how PR capabilities scale with size for a converter implementation.

If a PR is scaled in all three dimensions by linear scaling factor $\alpha$ as has been postulated for magnetics, its volume scales by $\alpha^3$. In the case of a PR with fixed $I_{Lo}$, maximum volumetric power density scales inversely with $\alpha$ as does operating frequency, both due to $G_f$. However, the minimum loss ratio, the maximum volumetric energy handling density, the maximum areal power density, and the areal loss density have no geometry dependence and therefore remain fixed regardless of $\alpha$. Table 10 summarizes these characteristics.

TABLE 10

Piezoelectric Resonator Scaling Properties

| Property | Geometry Dependence | Scaling (fixed $I_{Lo}$) |
|---|---|---|
| $\left(\frac{P_{out}}{vol}\right)$ (23) | $G_f$ | $\alpha^{-1}$ |

TABLE 10-continued

Piezoelectric Resonator Scaling Properties

| Property | Geometry Dependence | Scaling (fixed $I_{Lo}$) |
|---|---|---|
| $\left(\dfrac{E_{out}}{vol}\right)_{max}$ (26) | none | constant |
| $\left(\dfrac{P_{out}}{A_s}\right)_{max}$ (30) | none | constant |
| $\left(\dfrac{P_{loss}}{P_{out}}\right)_{min}$ (18) | none | constant |
| $\dfrac{P_{loss}}{A_s}$ (9) | none | constant |
| f (3) | $G_f$ | $\alpha^{-1}$ |

Thus, as volume is scaled downward ($\alpha$<1), maximum volumetric power density increases while minimum loss ratio (and therefore maximum efficiency) stays constant. These are favorable scaling properties for converter miniaturization.

9. Conclusions

Disclosed herein are techniques and structures for evaluating and selecting piezoelectric materials and vibration modes for power conversion. FOMs are established for achievable efficiency, volumetric energy handling density, and areal power density based on power converter operation. These FOMs depend on only material properties (and loss density limits if considered) and correspond to PR geometry conditions for realizing both maximum efficiency and maximum power density in PR designs.

The mechanical efficiency FOM depends on only $k^2$ and $Q_m$, and its corresponding geometry condition dictates the relative PR dimensions required to achieve maximum efficiency for a given operating point. Parallel modes are particularly advantageous for satisfying this condition with less-extreme planar shapes. Which vibration modes are compatible with a given operating space is likewise dictated by this geometry condition, which favors vibration modes with l as their smallest dimensions for most converter applications. The operating frequency at which maximum efficiency occurs is found to be the geometric mean of the PR's resonant and anti-resonant frequencies for the assumed converter operation.

The volumetric energy handling density and areal power density FOMs are constrained by the PR's geometry-normalized amplitude of resonance, which can be calculated based on material limits or an acceptable loss density. The volumetric energy handling density FOM is normalized to frequency, which permits direct comparison between vibration modes for a given converter switching and control requirement. The areal power density FOM provides insight into footprint requirements for planar-shaped PRs, though the utility of this FOM depends on whether its assumed area corresponds to the footprint area of a given PR configuration (this FOM is often scaled by the maximum-efficiency geometry condition when representing contour and radial modes). Both of these FOMs have the same geometry condition for l that corresponds to maximum power density for a given operating point.

The present disclosure illustrates the utility of the proposed FOMs to compare the capabilities of 30 PZT-based materials and seven PR vibration modes for PZT and lithium niobate. These materials and vibration modes vary immensely with respect to the FOMs, though FOMs tend to cluster according to vibration mode for variants of the same material. With the same $Q_m$ assumed for each mode, the shear modes demonstrate the highest achievable efficiencies, particularly for lithium niobate. In general, materials and modes with higher efficiency figures of merit are capable of achieving higher power densities for loss density limits. Perpendicular modes are capable of higher volumetric power densities for a given frequency but tend to be more planar, requiring more footprint area than parallel modes to meet the maximum-efficiency geometry condition. Lithium niobate also necessitates more extreme planar dimensions than PZT to meet this geometry condition, requiring more footprint area and/or higher frequency for the same volumetric power density.

Appendix A—Piezoelectric Resonator Wave Solution

In this Appendix, the PR's acoustic wave solution for each vibration mode is derived. Piezoelectric materials are governed by the following constitutive relations between mechanical strain (S), mechanical stress (T), electric field strength (E), and electric flux density (D):

$$S_{ij} = \frac{1}{2}\left(\frac{\partial u_i}{\partial x_j} + \frac{\partial u_j}{\partial x_i}\right) = s^E_{ijmn}T_{mn} + d_{mij}E_m \qquad (32)$$

$$D_i = d_{imn}T_{mn} + \varepsilon^T_{im}E_m \qquad (33)$$

and equation of motion:

$$\frac{\partial T_{ij}}{\partial x_i} = \rho\frac{\partial^2 u_j}{\partial c^2} \qquad (34)$$

Together, these equations determine the behavior of the PR states, which varies by vibration mode. Parameters for these equations are defined in Table 1, and i, j, m, and n specify tensor components using index notation.

A. One-Dimensional Stress/Strain Modes

Most vibration modes considered (length extensional, thickness shear, and thickness extensional) can be modeled by one-dimensional stress/strain (i.e., only one tensor component for each PR state in equations (32)-(34) may be considered). Thus, the coupled constitutive relations take the reduced form:

$$S = s^E T + dE \qquad (35)$$

$$D = dT + \varepsilon^T E \qquad (36)$$

To illustrate the PR behaviors for each vibration mode, a generalized Voigt notation can be adopted for all parameters without indices; the tensor components pertinent to each vibration mode are displayed in Table 11. A location along the l-dimension axis for parallel modes and a-dimension axis for perpendicular modes are herein referred to generally as "x".

TABLE 11

Parameters for each Vibration Mode

| Mode | $v_a$ | d | $s^E$ | $\varepsilon^T$ | k |
|---|---|---|---|---|---|
| Length Ext. (s) | $\sqrt{\dfrac{1}{\rho s_{11}^E}}$ | $d_{31}$ | $s_{11}^E$ | $\varepsilon_{33}^T$ | $k_{31} = \dfrac{d_{31}}{\sqrt{s_{11}^E \varepsilon_{33}^T}}$ |
| Length Ext. (e) | $\sqrt{\dfrac{1}{\rho s_{33}^D}}$ | $d_{33}$ | $s_{33}^E$ | $\varepsilon_{33}^T$ | $k_{33} = \dfrac{d_{33}}{\sqrt{s_{33}^E \varepsilon_{33}^T}}$ |
| Thickness shear (side) | $\sqrt{\dfrac{1}{\rho s_{55}^D}}$ | $d_{15}$ | $s_{55}^E$ | $\varepsilon_{11}^T$ | $k_{15} = \dfrac{d_{15}}{\sqrt{s_{55}^E \varepsilon_{11}^T}}$ |
| Thickness shear (end) | $\sqrt{\dfrac{1}{\rho s_{55}^E}}$ | $d_{15}$ | $s_{55}^E$ | $\varepsilon_{11}^T$ | $k_{15} = \dfrac{d_{15}}{\sqrt{s_{55}^D \varepsilon_{11}^S}}$ |
| Thickness Extensional | $\sqrt{\dfrac{c_{33}^D}{\rho}}$ | ** | ** | $\varepsilon_{33}^T$ | $k_t = \dfrac{e_{33}}{\sqrt{c_{33}^D \varepsilon_{33}^S}}$ |
| Contour Extensional | $\sqrt{\dfrac{1}{\rho s_{11}^E (1-\sigma^2)}}$ | $d_{31}$ | $s_{11}^E$ | $\varepsilon_{33}^T$ | $k_p = \sqrt{\dfrac{2 k_{31}^2}{1-\sigma}}$ |
| Radial | $\sqrt{\dfrac{1}{\rho s_{11}^E (1-\sigma^2)}}$ | $d_{31}$ | $s_{11}^E$ | $\varepsilon_{33}^T$ | $k_p = \sqrt{\dfrac{2 k_{31}^2}{1-\sigma}}$ |

In Table 11, the following measurement condition conversions apply: $\varepsilon_{11}^S = (1-k_{15}^2)\varepsilon_{11}^T$ $\varepsilon_{33}^S = (1-k_{33}^2)\varepsilon_{33}^T$ $S_{11}^D = (1-k_{31}^2)S_{11}^E$ $S_{33}^D = (1-k_{33}^2)S_{33}^E$ $S_{55}^D = (1-k_{15}^2)S_{55}^E$ $C_{33}^E = (1-k_t^2)C_{33}^D$. (**) Thickness extensional mode is more commonly represented by $e_{33}$ and $c_{33}$.

With the equation of motion (34), (35)-(36) create an acoustic wave equation for mechanical displacement u:

$$\frac{\partial^2 u}{\partial t^2} = v_a^2 \frac{\partial^2 u}{\partial x^2} \qquad (37)$$

The PR is assumed to resonate in the proximity of its lowest-frequency vibration mode for traction-free boundaries in FIGS. 2A-2G. Thus, the acoustic wave solution is sinusoidal in form:

$$u = \Delta \sin(\kappa x) e^{j\omega t} \qquad (38)$$

Inserting equation (38) into the constitutive relations and enforcing traction-free boundaries yields the solutions for S, T, and E; these solutions are displayed for each mode in Table 12.

TABLE 12

One-Dimensional Vibration Mode Derivations

| | Length Ext. (s) and Thickness Shear (e) | Length Ext. (e) and Thickness Shear (s) | Thickness Extensional |
|---|---|---|---|
| S | $\kappa\Delta\cos(\kappa x)e^{j\omega t}$ | $\kappa\Delta\cos(\kappa x)e^{j\omega t}$ | $\kappa\Delta\cos(\kappa x)e^{j\omega t}$ |
| T | $\dfrac{1}{s^E}\kappa\Delta(\cos(\kappa x) - \cos(\kappa_o))e^{j\omega t}$ | $\dfrac{1}{s^D}\kappa\Delta(\cos(\kappa x) - \cos(\kappa_o))e^{j\omega t}$ | $c^D\kappa\Delta(\cos(\kappa x) - \cos(\kappa_o))e^{j\omega t}$ |
| E | $\dfrac{\kappa\Delta}{d}(\cos(\kappa_o))e^{j\omega t}$ | $\dfrac{\kappa\Delta}{d(1-k^2)}(-k^2\cos(\kappa x) + \cos(\kappa_o))e^{j\omega t}$ | $\dfrac{c^D \kappa\Delta}{e(1-k^2)}(-k^2\cos(\kappa x) + \cos(\kappa_o))e^{j\omega t}$ |
| $I_L$ | $\kappa A G_f \dfrac{v_a d}{s^E}\Delta\sin(\kappa_o)$ | $\kappa A G_f \dfrac{v_a d}{s^E}\Delta\sin(\kappa_o)$ | $\kappa A G_f v_a e \Delta\sin(\kappa_o)$ |
| $\Delta_S$ | $\dfrac{1}{\kappa}S_{max}$ | $\dfrac{1}{\kappa}S_{max}$ | $\dfrac{1}{\kappa}S_{max}$ |
| $\Delta_T$ | $\dfrac{s^E}{\kappa}\dfrac{1}{1-\cos(\kappa_o)}T_{max}$ | $\dfrac{s^D}{\kappa}\dfrac{1}{1-\cos(\kappa_o)}T_{max}$ | $\dfrac{1}{c^D \kappa}\dfrac{1}{1-\cos(\kappa_o)}T_{max}$ |
| $\Delta_E$ | $\dfrac{d}{\kappa}\dfrac{1}{\cos(\kappa_o)}E_{max}$ | $\dfrac{d}{\kappa}\dfrac{(1-k^2)}{(\cos(\kappa_o)-k^2)}E_{max}$ | $\dfrac{e}{c^D \kappa}\dfrac{1}{(\cos(\kappa_o)-k^2)}E_{max}$ |
| $I_{LmaxS}$ | $AG_f \dfrac{v_a d}{s^E}S_{max}\sin(\kappa_o)$ | $AG_f \dfrac{v_a d}{s^E}S_{max}\sin(\kappa_o)$ | $AG_f \dfrac{v_a d}{s^E}S_{max}\sin(\kappa_o)$ |
| $I_{LmaxT}$ | $AG_f v_a d T_{max}\cot\left(\dfrac{\kappa_o}{2}\right)$ | $AG_f v_a d (1-k^2) T_{max}\cot\left(\dfrac{\kappa_o}{2}\right)$ | $AG_f v_a \dfrac{e}{c^D} T_{max}\cot\left(\dfrac{\kappa_o}{2}\right)$ |
| $I_{LmaxE}$ | $AG_f k^2 \varepsilon^T v_a E_{max}\tan(\kappa_o)$ | $AG_f k^2 \varepsilon^S v_a E_{max}\dfrac{\sin(\kappa_o)}{\cos(\kappa_o)-k^2}$ | $AG_f k^2 \varepsilon^S v_a E_{max}\dfrac{\sin(\kappa_o)}{\cos(\kappa_o)-k^2}$ |

Figure 12A:
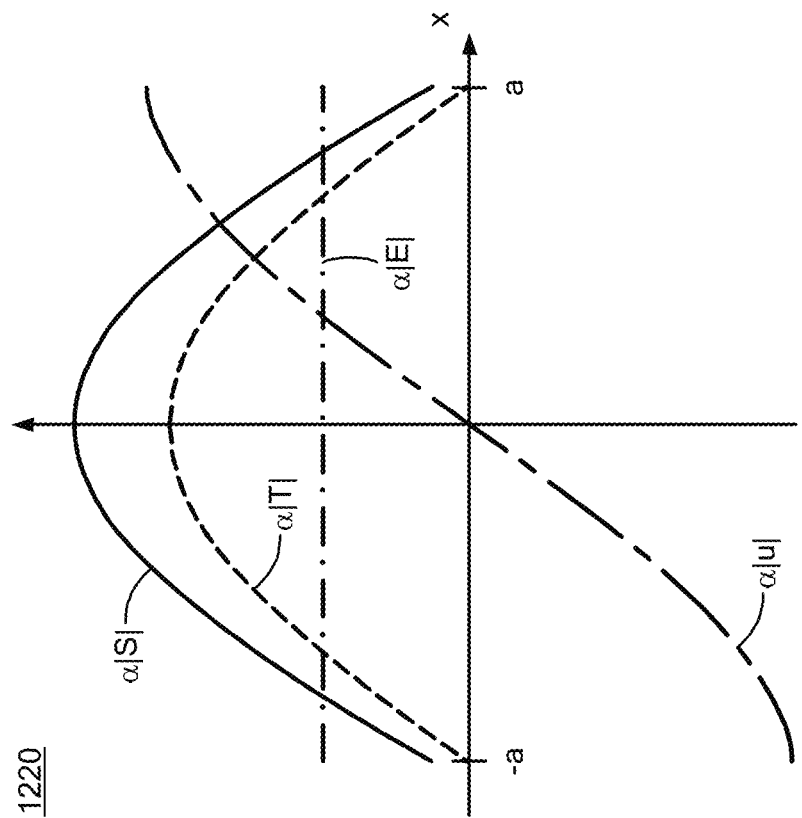
FIG. 12A is a plot showing PR vibration modes in which the applied and induced electric fields are parallel.
Figure 12B:
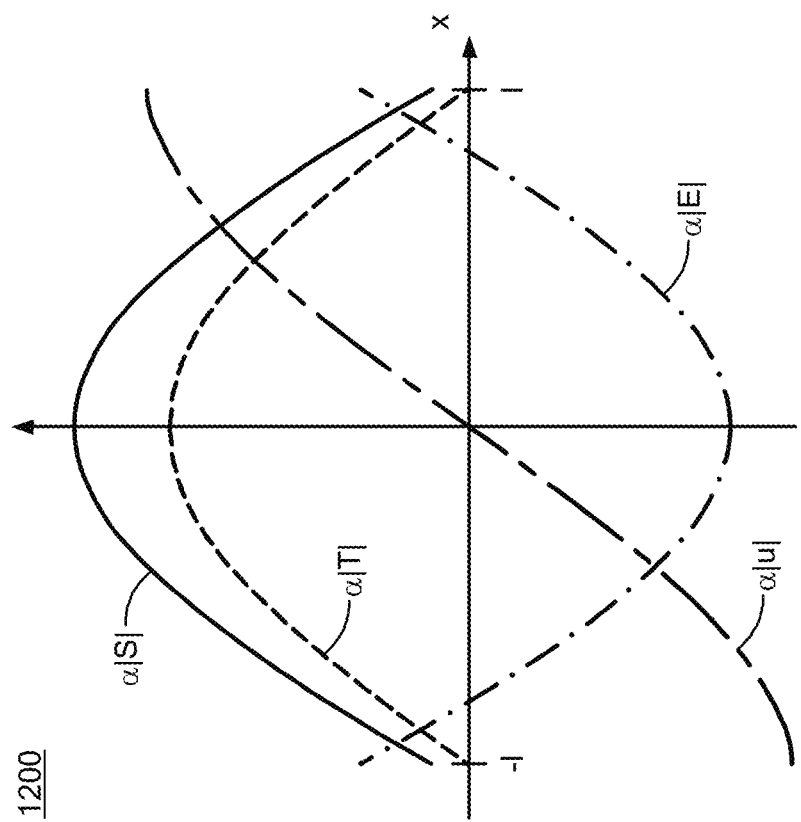
FIG. 12B is a plot showing PR vibration modes in which the applied and induced electric fields are perpendicular.

FIGS. 12A and 12B illustrate the relative amplitudes of u, S, T, and E along the axis of $G_f$ in a PR. FIG. 12A is a plot 1200 illustrating vibration modes in which the applied and induced E fields are parallel (∥). FIG. 12B is another plot 1220 illustrating vibration modes in which the applied and induced E fields are perpendicular (+). These states retain similar spacial dependencies across x for each vibration mode, though their specific directions may be different. Moreover, the maximum amplitudes for S, T, and E each occur at the center of the PR (at x=0).

This wave solution provides means to analyze the PR's mechanical and electrical limits, which is utilized in Section 5 and Appendix B for calculating maximum power density. Also, the Butterworth-Van Dyke circuit model (FIG. 4) can be derived from E.

B. Contour Extensional Mode

For contour extensional mode, it can be assumed that the PR to be under plane stress (i.e., consider only the normal stress components along the two axes perpendicular to the applied E field). These normal stresses are denoted with $T_1$ and $T_2$, and their coordinate plane is defined by the displacement arrows in FIG. 2F with the origin at the center of the PR. The constitutive relations then have the form:

$$T_1 = \frac{1}{s_{11}^E(1-\sigma^2)}\left(\frac{\partial u_1}{\partial x_1} + \sigma\frac{\partial u_2}{\partial x_2}\right) - \frac{d_{31}}{s_{11}^E(1-\sigma)}E \tag{39}$$

$$T_2 = \frac{1}{s_{11}^E(1-\sigma^2)}\left(\sigma\frac{\partial u_1}{\partial x_1} + \frac{\partial u_2}{\partial x_2}\right) - \frac{d_{31}}{s_{11}^E(1-\sigma)}E \tag{40}$$

$$D = \frac{d_{31}}{s_{11}^E(1-\sigma)}\left(\frac{\partial u_1}{\partial x_1} + \frac{\partial u_2}{\partial x_2}\right) + \varepsilon_{33}^T(1-k_p^2)E \tag{41}$$

Considered along with equation (34), equations (39)-(41) constitute an acoustic wave equation for mechanical displacement u. Its solution can be approximated by two separate waves, which can be assumed to be identical along their respective dimensions:

$$u_1 = \Delta \sin(\kappa x_1)e^{j\omega t} \tag{42}$$

$$u_2 = \Delta \sin(\kappa x_2)e^{j\omega t} \tag{43}$$

Inserting equations (42) and (43) into equations (39) and (40) and enforcing the boundary conditions of $T_1=0$ at $x_1=\pm a$ and $T_2=0$ at $x_2=\pm a$ provides the analytical solution shown in Table 13 for the PR's S, T, and E states. This solution follows the relative amplitudes illustrated in plot 1220 of FIG. 12B.

TABLE 13

Planar Vibration Mode Derivations

| | Contour Extensional | Radial |
|---|---|---|
| S | $S_1 = \kappa\Delta\cos(\kappa x_1)e^{j\omega t}$ | $S_{rr} = \frac{\kappa}{2}\Delta(J_0(\kappa r) - J_2(\kappa r))e^{j\omega t}$ |
| | $S_2 = \kappa\Delta\cos(\kappa x_2)e^{j\omega t}$ | $S_{\theta\theta} = \frac{1}{r}\Delta J_1(\kappa r)e^{j\omega t}$ |
| T | $T_1 = \frac{\kappa\Delta e^{j\omega t}}{s_{11}^E(1-\sigma^2)}(\cos(\kappa x_1) + \sigma\cos(\kappa x_2) - (1+\sigma)\cos(\kappa_o))$ | $T_{rr} = \frac{\Delta e^{j\omega t}}{s_{11}^E(1-\sigma^2)}\left(\frac{\kappa}{2}(J_0(\kappa r) - J_2(\kappa r)) + \frac{\sigma}{r}J_1(\kappa r) - \kappa\Psi\right)$ |
| | $T_2 = \frac{\kappa\Delta e^{j\omega t}}{s_{11}^E(1-\sigma^2)}(\sigma\cos(\kappa x_1) + \sigma\cos(\kappa x_2) - (1+\sigma)\cos(\kappa_o))$ | $T_{\theta\theta} = \frac{\Delta e^{j\omega t}}{s_{11}^E(1-\sigma^2)}\left(\frac{\kappa\sigma}{2}(J_0(\kappa r) - J_2(\kappa r)) + \frac{1}{r}J_1(\kappa r) - \kappa\Psi\right)$ |
| E | $\frac{\kappa\Delta}{d_{31}}(\cos(\kappa_o))e^{j\omega t}$ | $\frac{\kappa\Delta}{d_{31}(1+\sigma)}\Psi e^{j\omega t}$ |
| $I_L$ | $2\kappa AG_f\frac{v_a d_{31}}{s_{11}^E(1-\sigma)}\Delta\sin(\kappa_o)$ | $\kappa_o v_a \frac{2\pi d_{31}}{s_{11}^E(1-\sigma)}\Delta J_1(\kappa_o)$ |
| $\Delta_S$ | $\frac{1}{\kappa}S_{max}$ | $\frac{2}{\kappa}S_{max}$ |
| $\Delta_T$ | $\frac{s_{11}^E(1-\sigma)}{\kappa(1-\cos(\kappa_o))}T_{max}$ | $\frac{s_{11}^E(1-(\sigma)^2)}{\kappa\left(\frac{1}{2}(1+\sigma) - \Psi\right)}T_{max}$ |
| $\Delta_E$ | $\frac{d_{31}}{\kappa}\frac{1}{\cos(\kappa_o)}E_{max}$ | $\frac{d_{31}(1+\sigma)}{\kappa\Psi}E_{max}$ |
| $I_{LmaxS}$ | $2AG_f v_a \frac{d_{31}}{s_{11}^E(1-\sigma)}S_{max}\sin(\kappa_o)$ | $AG_f \frac{4d_{31}v_a}{s_{11}^E(1-\sigma)}S_{max}J_1(\kappa_o)$ |
| $I_{LmaxT}$ | $2AG_f v_a d_{31} T_{max}\cot\left(\frac{\kappa_o}{2}\right)$ | $AG_f \frac{2v_a d_{31}(1+\sigma)}{\frac{1}{2}(1+\sigma) - \Psi}T_{max}J_1(\kappa_o)$ |
| $I_{LmaxE}$ | $AG_f v_a k_p^2 \varepsilon_{33}^T E_{max}\tan(\kappa_o)$ | $AG_f v_a k_p^2 \varepsilon_{33}^T(1+\sigma)E_{max}\frac{J_1(\kappa_o)}{\Psi}$ |

C. Radial Mode

For the radial vibration mode, it can be assumed that only planar stress components parallel to the electrodes; E is again applied only in the polarization direction. This time, a cylindrical coordinate system is adopted in which r is the radial coordinate and θ is the hoop coordinate. Thus, the constitutive relations are:

$$T_{rr} = \frac{1}{s_{11}^E(1-\sigma^2)}\left(\frac{\partial u_r}{\partial r} + \sigma\frac{u_r}{r}\right) - \frac{d_{31}}{s_{11}^E(1-\sigma)}E \quad (44)$$

$$T_{\theta\theta} = \frac{1}{s_{11}^E(1-\sigma^2)}\left(\sigma\frac{\partial u_r}{\partial r} + \frac{u_r}{r}\right) - \frac{d_{31}}{s_{11}^E(1-\sigma)}E \quad (45)$$

$$D = \frac{d_{31}}{s_{11}^E(1-\sigma)}\left(\frac{\partial u_r}{\partial r} + \frac{u_r}{r}\right) + \varepsilon_{33}^T(1-k_p^2)E \quad (46)$$

Together with the equation of motion (34), these constitute a wave equation for mechanical displacement $u_r$ with solution $$u_r = \Delta J_1(\kappa r)e^{j\omega t} \quad (47)$$

for which $J_n$ is the Bessel function of first kind and nth order. Inserting equation (47) into equation (44) and enforcing the boundary condition $T_{rr}=0$ at $r=a$ yields the analytical solution in Table 13 for the PR's S, T, and E states, which follows the illustrative plot 1220 of FIG. 12B for x=r. In this solution, the following substitution is made:

$$\Psi = \frac{1}{2}J_0(\kappa_o) - \frac{1}{2}J_2(\kappa_o) + \frac{\sigma}{\kappa_o}J_1(\kappa_o) \quad (48)$$

The geometry-normalized wave numbers corresponding to $\mathit{f}_r$ and $\mathit{f}_{ar}$ in radial mode are solutions to the following transcendental equations, respectively:

$$\kappa_{o,r}\frac{J_0(\kappa_{o,r})}{J_1(\kappa_{o,r})} = 1 - \sigma \quad (49)$$

$$\kappa_{o,ar}\frac{J_0(\kappa_{o,ar})}{J_1(\kappa_{o,ar})} = 1 - \sigma - \frac{k_p^2}{1-k_p^2}(1+\sigma) \quad (50)$$

If needed, Bessel functions $J_0(\kappa_o)$, $J_1(\kappa_o)$, and $J_2(\kappa_o)$ can be approximated by series expansions around $\kappa_{o,r}$; second-order expansions around $\kappa_o=2$ are shown in Table 14.

TABLE 14

Bessel Function Expansions

| Function | Expansion Around $\kappa_o = 2$ |
|---|---|
| $\kappa_o\frac{J_0(\kappa_o)}{J_1(\kappa_o)}$ | $0.776 - 1.525(\kappa_o - 2) - 0.789(\kappa_o - 2)^2$ |
| $J_0(\kappa_o)$ | $0.224 - 0.577(\kappa_o - 2) - 0.0322(\kappa_o - 2)^2$ |
| $J_1(\kappa_o)$ | $0.577 - 0.645(\kappa_o - 2) - 0.2(\kappa_o - 2)^2$ |
| $J_2(\kappa_o)$ | $0.353 - 0.224(\kappa_o - 2) - 0.0560(\kappa_o - 2)^2$ |

The geometry-normalized wave number that corresponds to the minimum-loss-ratio operating frequency is then:

$$\bar{\kappa}_o = \frac{2\kappa_{o,r}\kappa_{o,ar}}{\kappa_{o,r} + \kappa_{o,ar}} \quad (51)$$

Finally, E in Table 13 can be reduced to the circuit model of FIG. 4 with the parameters shown in Table 15.

TABLE 15

Circuit Model Parameters for Radial Vibration Mode

| Parameter | Radial Mode Expression |
|---|---|
| $G_f$ | $\frac{1}{a}$ |
| $C_p$ | $\varepsilon^T(1-k_p^2)\frac{A}{2l}$ |
| C | $\frac{2(1+\sigma)}{\kappa_{o,r}^2 - (1-\sigma^2)}\frac{k_p^2}{1-k_p^2}C_p$ |
| L | $\frac{1}{2G_f^2 v_a^2 C_p}\frac{1-k_p^2}{k_p^2}\frac{\kappa_{o,r}^2 - (1-\sigma^2)}{\kappa_{o,r}^2(1+\sigma)}$ |
| R | $\frac{1}{Q_m}\sqrt{\frac{L}{C}}$ |

Appendix B—Maximum IL Derivation

In this Appendix, maximum permissible $I_L$ is determined based on physical limits for the PR's S, T, and E states. To begin, derive the relationship between $I_L$ and the PR's maximum displacement amplitude (Δ) using the coupled state equations in (32)-(34) and the solution in Tables 12 and 13. Illustrating with a uni-dimensional vibration mode, inserting equation (32) into equation (33) yields:

$$D = \frac{d}{s^E}\frac{\partial u}{\partial x} + \varepsilon^T(1-k^2)E \quad (52)$$

Integrating across the volume of the PR (i.e., across electrode area A and distance 2l) gives:

$$Q = AG_f\frac{d}{s^E}u(G_f^{-1}) + \frac{A}{2l}\varepsilon^T(1-k^2)v_{p,1} \quad (53)$$

for which $v_{p,1}$ is the first harmonic approximation of $v_p$. Finally, taking the time derivative yields:

$$i_{in} = j\omega AG_f\frac{d}{s^E}u(G_f^{-1}) + C_p\frac{dv_{p,1}}{dt} \quad (54)$$

in which $i_{in}$ can be considered the current entering the PR through its top terminal in the model of FIG. 4. This process can be repeated for the planar modes, resulting in a similar form as equation (54) for contour extensional mode and the following form for radial mode:

$$i_{in} = j\omega a\frac{2\pi d_{31}}{s_{11}^E(1-\sigma)}\Delta J_1(\kappa_o)e^{j\omega t} + C_p\frac{dv_{p,1}}{dt} \quad (55)$$

These expressions for $i_{in}$ correspond to FIG. 4 such that $I_L$ equals the magnitude of the first term in equation (54) or equation (55). $I_L$ is shown for each operating mode in Table 12.

From here, S, T and E can each be related to $I_L$ through $\Delta$. As shown in FIGS. 12A and 12B, the maximum S, T and E each occur at x=0, so their respective equations in Tables 12 and 13 can be rearranged to focus on x=0 to reach $\Delta_S$, $\Delta_T$, and $\Delta_E$ as functions of $S_{max}$, $T_{max}$ and $E_{max}$, respectively ($S_{max}$ and $T_{max}$ refer to the maximum principal strains and stresses for planar modes; this requires taking the limit of each quantity as r→0 for radial mode). Each $\Delta$ can then be directly inserted into $I_L$, resulting in the strain-limited ($I_{LmaxS}$), stress-limited ($I_{LmaxT}$), and electric-field-limited ($I_{LmaxE}$) maximum amplitudes of resonance displayed in Tables 12 and 13. It should be noted that $I_{LmaxS}$, $I_{LmaxT}$, and $I_{LmaxE}$ all have the same geometry terms ($AG_f$), which allows direct comparison of their geometry-normalized quantities as shown above.

Appendix C—Extended PSSS Validation Results

PSSS results validating the length extensional mode (with end electrodes) FOMs are shown in Table 13. Results for all other considered modes are displayed in Table 16.

TABLE 16

Extended Figure of Merit Validation Using APC International PZT Parts

| Vibration Mode | Material | $\frac{P_{loss}}{P_{out}}$ vs. (18) | $\kappa_o$ vs. (21) (radians) | $\frac{E_{out}}{vol}$ vs. (26) (J/m³) | $\frac{P_{out}}{A_s}$ vs. (30) (W/cm²) | $\frac{P_{loss}}{A_s}$ vs. 1.00 (W/cm²) |
|---|---|---|---|---|---|---|
| Length Ext. | 840 | .0602 ∣ .0570 | 1.607 ∣ 1.613 | 112.3 ∣ 112.1 | 17.52 ∣ 17.54 | 1.054 |
| (s) | 841 | .0236 ∣ .0232 | 1.603 ∣ 1.608 | 248.5 ∣ 247.8 | 43.12 ∣ 43.13 | 1.018 |
| | 880 | .0414 ∣ .0399 | 1.597 ∣ 1.601 | 142.0 ∣ 142.4 | 24.91 ∣ 25.04 | 1.032 |
| Thickness | 840 | .0108 ∣ .0107 | 1.379 ∣ 1.373 | 803.2 ∣ 809.4 | 92.80 ∣ 93.14 | .9992 |
| Shear (s) | 841 | .0043 ∣ .0044 | 1.395 ∣ 1.394 | 1986 ∣ 1979 | 230.1 ∣ 229.1 | .9984 |
| | 880 | .0103 ∣ .0103 | 1.455 ∣ 1.461 | 840.2 ∣ 836.3 | 96.68 ∣ 96.62 | 1.000 |
| Thickness | 840 | .0093 ∣ .0092 | 1.810 ∣ 1.795 | 1004 ∣ 1009 | 108.7 ∣ 108.4 | 1.006 |
| Shear (e) | 841 | .0038 ∣ .0038 | 1.776 ∣ 1.769 | 2377 ∣ 2396 | 260.2 ∣ 261.3 | .9918 |
| | 880 | .0096 ∣ .0096 | 1.683 ∣ 1.689 | 938.2 ∣ 932.8 | 104.3 ∣ 104.1 | 1.001 |
| Thickness | 842 | .0243 ∣ .0240 | 1.483 ∣ 1.490 | 195.1 ∣ 193.5 | 41.88 ∣ 41.70 | 1.019 |
| Extensional | 844 | .0096 ∣ .0096 | 1.483 ∣ 1.490 | 485.5 ∣ 483.6 | 104.2 ∣ 104.3 | .9999 |
| | 881 | .0160 ∣ .0159 | 1.491 ∣ 1.497 | 293.8 ∣ 293.2 | 62.79 ∣ 62.94 | 1.005 |
| Contour | 840 | .0159 ∣ .0158 | 1.708 ∣ 1.712 | 271.8 ∣ 272.4 | 62.96 ∣ 63.22 | 1.001 |
| Extensional | 841 | .0054 ∣ .0054 | 1.715 ∣ 1.718 | 826.1 ∣ 826.7 | 185.3 ∣ 185.8 | .9921 |
| | 880 | .0124 ∣ .0123 | 1.658 ∣ 1.665 | 362.1 ∣ 361.2 | 80.99 ∣ 81.16 | 1.000 |
| Radial | 840 | .0163 ∣ .0161 | 2.221 ∣ 2.092 | 269.5 ∣ 271.0 | 62.3 ∣ 62.30 | 1.014 |
| | 841 | .0056 ∣ .0056 | 2.292 ∣ 2.276 | 809.5 ∣ 811.1 | 180.1 ∣ 180.1 | 1.008 |
| | 880 | .0126 ∣ .0125 | 2.147 ∣ 2.148 | 355.4 ∣ 357.0 | 79.45 ∣ 79.85 | 1.002 |

Each mode is validated with the hard PZT materials for which APC International provides all relevant parameters (or the ability to calculate such). It should be noted that the energy and power density quantities are validated for all materials based on loss density constraint (9), though the practical relevance of considered area $A_s$ in this calculation depends on the specific vibration mode and mounting structure.

Appendix D—Characterization and Calculations for Experimental Validation

This Appendix provides the characterization and loss calculations utilized for experimental validation.

A. PR Characterization

First, characterize each PR in order to calculate its FOMs based on physical properties. $Q_m$ can be calculated based on the PR's 3 dB bandwidth at resonance as measured using a network analyzer:

$$Q_m = \frac{f_r}{BW_{3dB}} \quad (56)$$

Further, the effective k can be calculated based on the observed resonant and anti-resonant frequencies:

$$k_{eff} = \sqrt{\frac{f_{ar}^2 - f_r^2}{f_{ar}^2}} \quad (57)$$

This enables the following mode-specific k calculations:

$$k_\parallel^2 = \frac{\pi}{2}\sqrt{1-k_{eff}^2}\cot\left(\frac{\pi}{2}\sqrt{1-k_{eff}^2}\right) \quad (58)$$

$$k_+^2 = \frac{1}{1-\frac{2}{\pi}\sqrt{1-k_{eff}^2}\tan\left(\frac{\pi}{2\sqrt{1-k_{eff}^2}}\right)} \quad (59)$$

$$k_{p(radial)}^2 = \frac{(1-\sigma)J_1(\kappa_{ar}) - \kappa_{ar}J_0(\kappa_{ar})}{2J_1(\kappa_{ar}) - \kappa_{ar}J_0(\kappa_{ar})} \quad (60)$$

B. Minimum-Loss-Ratio Power

The output power associated with the minimum loss ratio can be calculated based on the geometry condition of equation (17). To best represent the PR's behavior in the converter, switch capacitances to $C_p$ can be added for this calculation as follows:

$$C_{eff} = C_p + 2C_{switch} \quad (61)$$

At 50 V, the switches in the converter prototype each have charge-equivalent capacitances of approximately 250 pF. The output power corresponding to the minimum loss ratio is then:

$$P_{out} = \hat{G}B_o V_{in}^2 = C_{eff}fV_{in}^2 \quad (62)$$

C. Experimental PR Loss Ratio

To determine the experimental loss ratio of the PR, the influence of the Schottky diode rectifier (the largest non-PR source of loss in the converter prototype) can be extracted from the measured output power. The PR loss ratio is calculated from experimental results using $$\left(\frac{P_{loss}}{P_{out}}\right)_{PR} = \frac{P_{in} - P^*_{out}}{P^*_{out}} \quad (63)$$

where $P^*_{out}$ is the effective output power of the PR. The effective output voltage seen by the PR (due to the rectifier) is $V^*_{out} = V_{out} + V_{fwd}$, where the forward voltage drop of each Schottky diode is assumed to be $V_{fwd} = 0.35$ V. Thus, the effective output power of the PR is $$P^*_{out} = P_{out} \frac{V_{out} + V_{fwd}}{V_{out}} \quad (4)$$

and the loss ratio for the PR is therefore approximated as:

$$\left(\frac{P_{loss}}{P_{out}}\right)_{PR} = \frac{P_{in} - P_{out}\frac{V_{out} + V_{fwd}}{V_{out}}}{P_{out}\frac{V_{out} + V_{fwd}}{V_{out}}} \quad (65)$$

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

References in the disclosure to "one embodiment," "an embodiment," "some embodiments," or variants of such phrases indicate that the embodiment(s) described can include a particular feature, structure, or characteristic, but every embodiment can include the particular feature, structure, or characteristic. Moreover, such phrases are not necessarily referring to the same embodiment(s). Further, when a particular feature, structure, or characteristic is described in connection knowledge of one skilled in the art to affect such feature, structure, or characteristic in connection with other embodiments whether or not explicitly described.

The disclosed subject matter is not limited in its application to the details of construction and to the arrangements of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

All publications and references cited herein are expressly incorporated herein by reference in their entirety.

The invention claimed is:

1. A power converter having a specified voltage $V_{in}$ and a specified power level $P_{out}$, the power converter comprising:
   a piezoelectric resonator (PR) configured for energy transfer between an input and an output of the converter, the PR having an area A, a distance 2l between first and second electrodes of the PR, and a dimensions value G defined as $$G = G_f \frac{A}{l} = \frac{B}{B_o}$$

where $G_f$ is a geometry-dependent factor of a frequency at which acoustic waves travel through the PR, B is proportional to an operating frequency of the PR times a capacitance of the PR, $B_o$ is a geometry-normalized representation of B, where the PR satisfies the following conditions for the specified $V_{in}$ and $P_{out}$:

1. G is substantially equal to $$\hat{G} = \frac{P_{out}}{V_{in}^2 B_o},$$

and 2. l is substantially equal to $$\hat{l} = 2\pi \frac{B_o V_{in}}{I_{Lmaxo}},$$

where $I_{Lmaxo}$ is an amplitude of resonance of the PR.

2. The power converter of claim 1, wherein G is equal to $\hat{G}$ within 10%.

3. The power converter of claim 1, wherein G is equal to $\hat{G}$ within 20%.

4. The power converter of claim 1, wherein l is equal to $\hat{l}$ within 10%.

5. The power converter of claim 1, wherein l is equal to $\hat{l}$ within 20%.

6. The converter of claim 1 wherein $P_{out}$ is either a rated power output or a typical power output of the power converter for a given input voltage.

7. The power converter of claim 1, where $I_{Lmaxo}$ is a geometry-normalized maximum of $I_L$, and $I_L$ is an amplitude of resonance of the PR at $P_{out}$ for a given input voltage.

8. The power converter of claim 1, wherein $G_f$ corresponds to a frequency-setting dimension as defined in the following:

$$f = \frac{\kappa}{2\pi} v_a = G_f \frac{\kappa_o}{2\pi} v_a,$$

in which in which $f$ is a frequency at which acoustic waves travel through the PR, $\kappa$ is a wave number of the PR, and $v_a$ is an acoustic velocity of the PR.

9. The power converter of claim 1, wherein the PR is configured to operate in at least one of:
- a perpendicular vibration mode;
- a parallel vibration mode;
- a shear vibration mode; or
- a length extensional mode.

10. The power converter of claim 9, wherein the perpendicular vibration mode includes at least one of:
- a length extensional mode;
- a thickness shear mode;
- a contour extensional mode; or
- a radial mode.

11. The power converter of claim 9, wherein the parallel vibration mode includes at least one of:
- a length extensional mode;
- a thickness extensional mode; and
- a thickness shear.

12. The power converter of claim 1 wherein the PR is one of a plurality of PRs comprised within the power converter, wherein at least two of the plurality of PRs are configured to operate in a length extensional mode in parallel.

13. The power converter of claim 1, further comprising:
- a plurality of switches configured to operate in accordance with one or more switching sequences to transfer energy between the input and output of the converter via the PR; and
- a controller for controlling the switching sequences.

14. The power converter of claim 13, wherein ones of the one or more switching sequences include a sequence of voltages to be applied to the PR, wherein ones of the voltages can include $V_{in}$, $-V_{in}$, $V_{in}-V_{out}$, $V_{out}-V_{in}$, $V_{out}$, $-V_{out}$, or Zero, where $V_{in}$ and $V_{out}$ correspond to the input and output voltage of the converter in that order or in reverse order, and Zero corresponds to the PR being short-circuited.

15. The power converter of claim 14, wherein the switching sequences include at least one of:
- $V_{in}-V_{out}$, Zero, $V_{out}$;
- $V_{in}$, $V_{in}-V_{out}$, $V_{out}$; or
- $V_{in}$, $V_{in}-V_{out}$, Zero, $V_{out}$.

16. The power converter of claim 14, wherein the switching sequences include at least one of:
- $V_{in}$, Zero, $V_{out}-V_{in}$;
- $V_{in}$, $V_{out}-V_{in}$, $V_{out}$; or
- $V_{in}$, Zero, $V_{out}-V_{in}$, $V_{out}$.

* * * * *